(12) United States Patent
Kim et al.

(10) Patent No.: US 10,381,490 B2
(45) Date of Patent: Aug. 13, 2019

(54) SEMICONDUCTOR DEVICES

(71) Applicant: Samsung Electronics Co., Ltd., Suwon-si (KR)

(72) Inventors: Jae-Jung Kim, Suwon-si (KR); Dong-Soo Lee, Gunpo-si (KR); Sang-Yong Kim, Suwon-si (KR); Jin-Kyu Jang, Hwaseong-si (KR); Won-Keun Chung, Seoul (KR); Sang-Jin Hyun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/040,807

(22) Filed: Jul. 20, 2018

(65) Prior Publication Data

US 2019/0088798 A1    Mar. 21, 2019

(30) Foreign Application Priority Data

Sep. 18, 2017   (KR) ......................... 10-2017-0119813

(51) Int. Cl.
   *H01L 21/8234*   (2006.01)
   *H01L 29/792*    (2006.01)
   (Continued)

(52) U.S. Cl.
   CPC .... *H01L 29/7926* (2013.01); *H01L 21/28088* (2013.01); *H01L 21/82345* (2013.01); *H01L 21/823842* (2013.01); *H01L 27/0922* (2013.01); *H01L 29/4966* (2013.01); *H01L 29/66545* (2013.01); *H01L 29/785* (2013.01)

(58) Field of Classification Search
   CPC .......................... H01L 29/4966; H01L 27/1104
   See application file for complete search history.

(56) References Cited

U.S. PATENT DOCUMENTS 9,082,702 B2    7/2015  Lei et al.
9,177,865 B2 *  11/2015 Kim ................. H01L 21/82345
(Continued)

OTHER PUBLICATIONS

Office Action dated Dec. 5, 2018 from the Singapore Patent Office for Singapore Patent Application No. 10201807790Y.

*Primary Examiner* — Thao P Le
(74) *Attorney, Agent, or Firm* — Muir Patent Law, PLLC

(57) ABSTRACT

A semiconductor device includes a first transistor having a first threshold voltage, and including first channels, first source/drain layers connected to opposite sidewalls of the first channels, and a first gate structure surrounding the first channels and including a first gate insulation pattern, a first threshold voltage control pattern, and a first workfunction metal pattern sequentially stacked. The semiconductor device includes a second transistor having a second threshold voltage greater than the first threshold voltage, and including second channels, second source/drain layers connected to opposite sidewalls of the second channels, and a second gate structure surrounding the second channels and including a second gate insulation pattern, a second threshold voltage control pattern, and a second workfunction metal pattern sequentially stacked. A thickness of the second threshold voltage control pattern is equal to or less than a thickness of the first threshold voltage control pattern.

20 Claims, 30 Drawing Sheets

(51) Int. Cl.
*H01L 27/092* (2006.01)
*H01L 29/49* (2006.01)
*H01L 29/78* (2006.01)
*H01L 21/8238* (2006.01)
*H01L 21/28* (2006.01)
*H01L 29/66* (2006.01)

(56) References Cited

U.S. PATENT DOCUMENTS

| | | |
|---|---|---|
| 9,455,201 B2 * | 9/2016 | Joshi .................... H01L 27/088 |
| 9,466,610 B1 | 10/2016 | Yang |
| 9,496,143 B2 | 11/2016 | Kim et al. |
| 9,653,289 B1 | 5/2017 | Balakrishnan et al. |
| 9,659,937 B2 | 5/2017 | Chang et al. |
| 2006/0071275 A1 * | 4/2006 | Brask .................... H01L 21/845 257/350 |
| 2015/0194423 A1 | 7/2015 | Wang et al. |
| 2015/0243563 A1 * | 8/2015 | Lee .................. H01L 21/82345 257/392 |
| 2015/0243658 A1 * | 8/2015 | Joshi .................. H01L 27/0886 257/392 |
| 2015/0262828 A1 * | 9/2015 | Brand ............. H01L 21/823842 438/592 |
| 2016/0093535 A1 | 3/2016 | Xu et al. |
| 2016/0225868 A1 | 8/2016 | Kim et al. |
| 2016/0358921 A1 | 12/2016 | Park et al. |
| 2017/0069634 A1 | 3/2017 | Kim |
| 2017/0117190 A1 | 4/2017 | Chung et al. |
| 2017/0148891 A1 | 5/2017 | Lai et al. |
| 2017/0250291 A1 | 8/2017 | Lee et al. |
| 2019/0067282 A1 * | 2/2019 | Chen .................. H01L 27/0922 |

* cited by examiner

FIG. 1
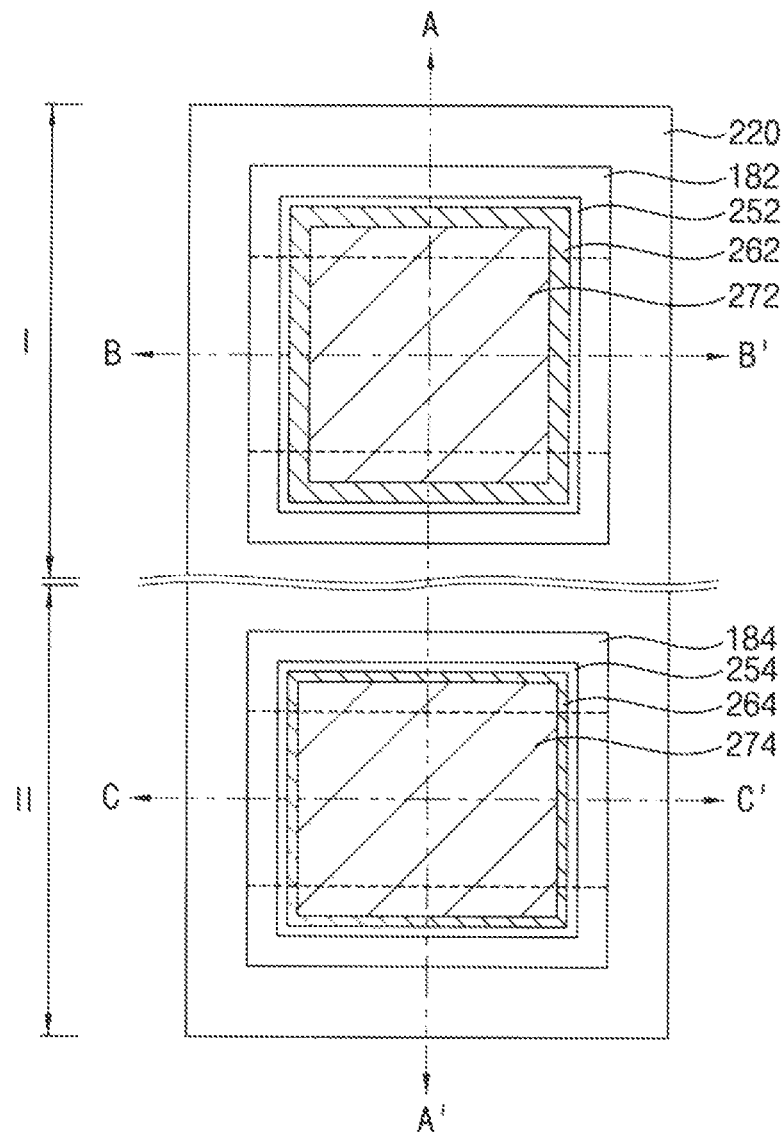
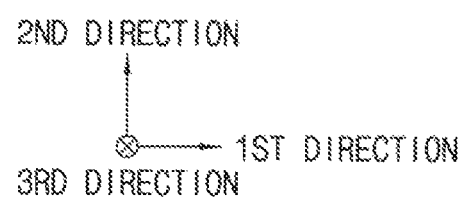

FIG. 2B
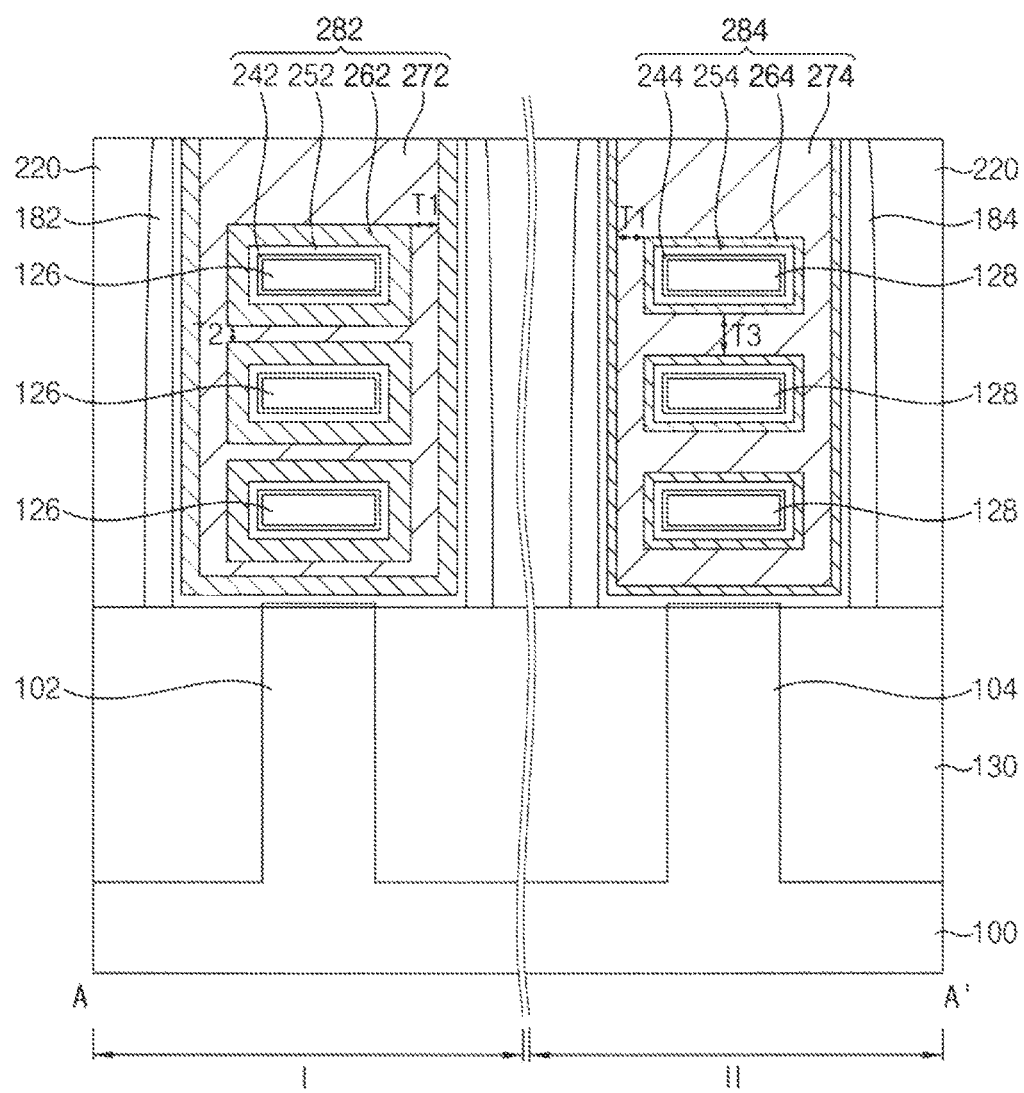
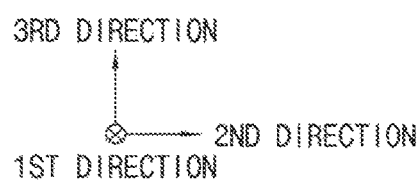

FIG. 5
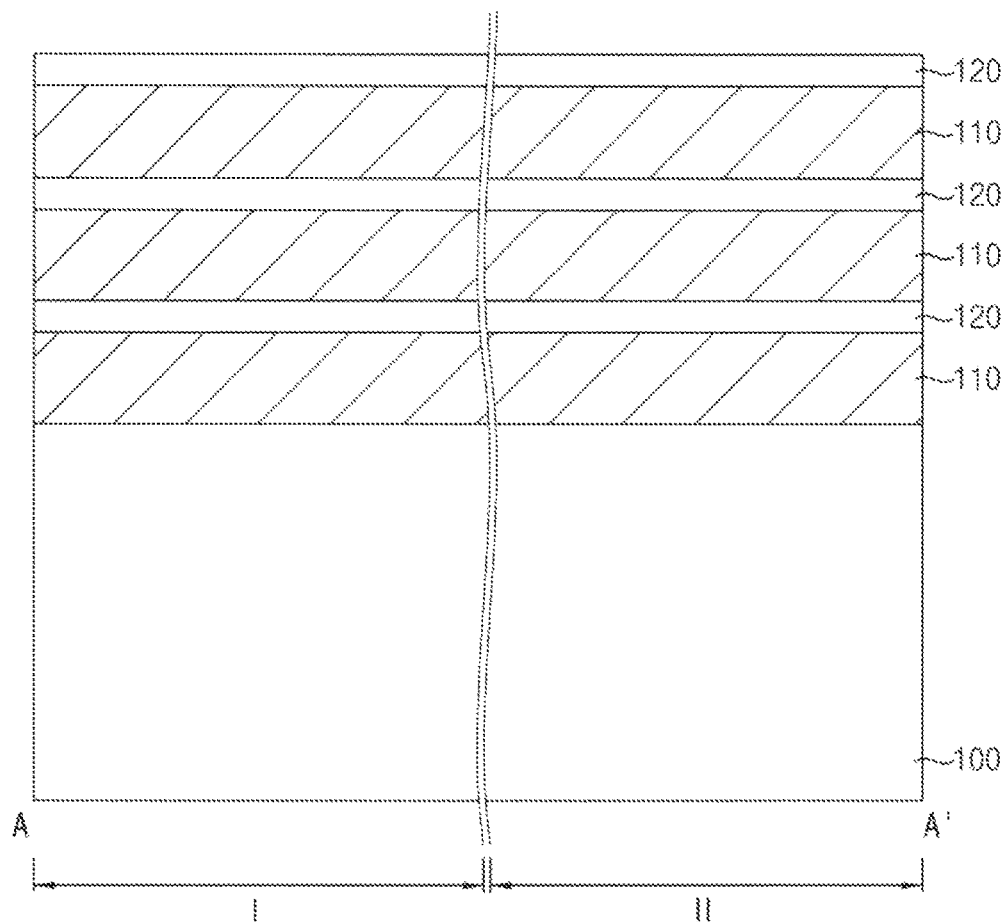
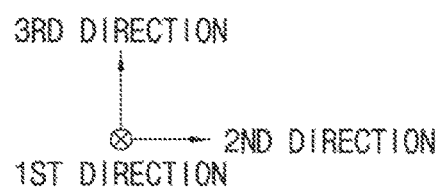

FIG. 10
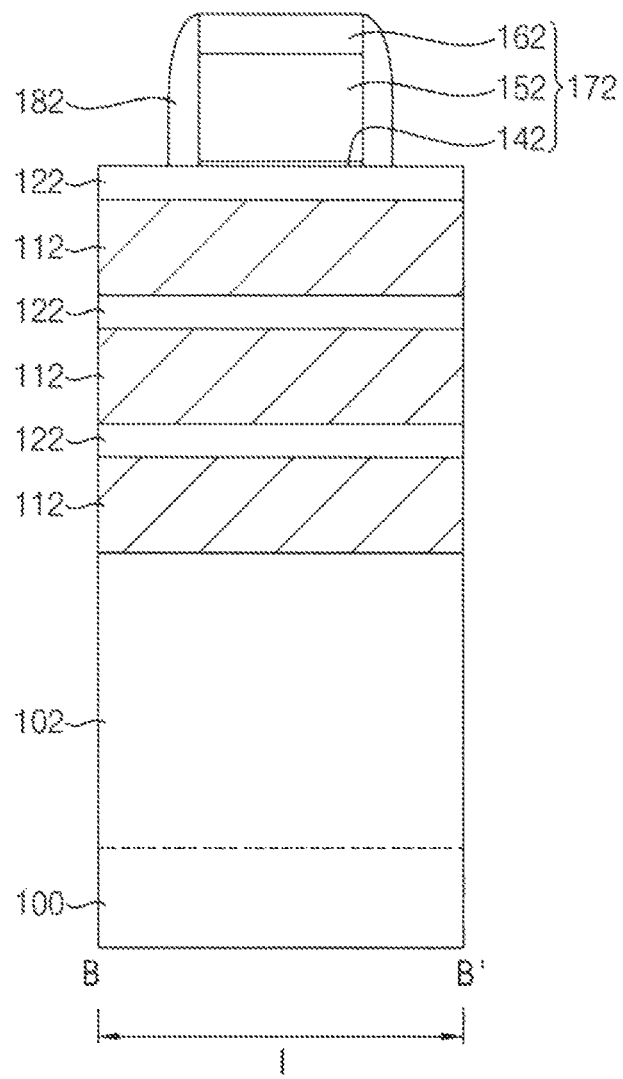
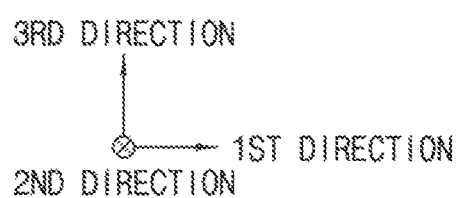

FIG. 11
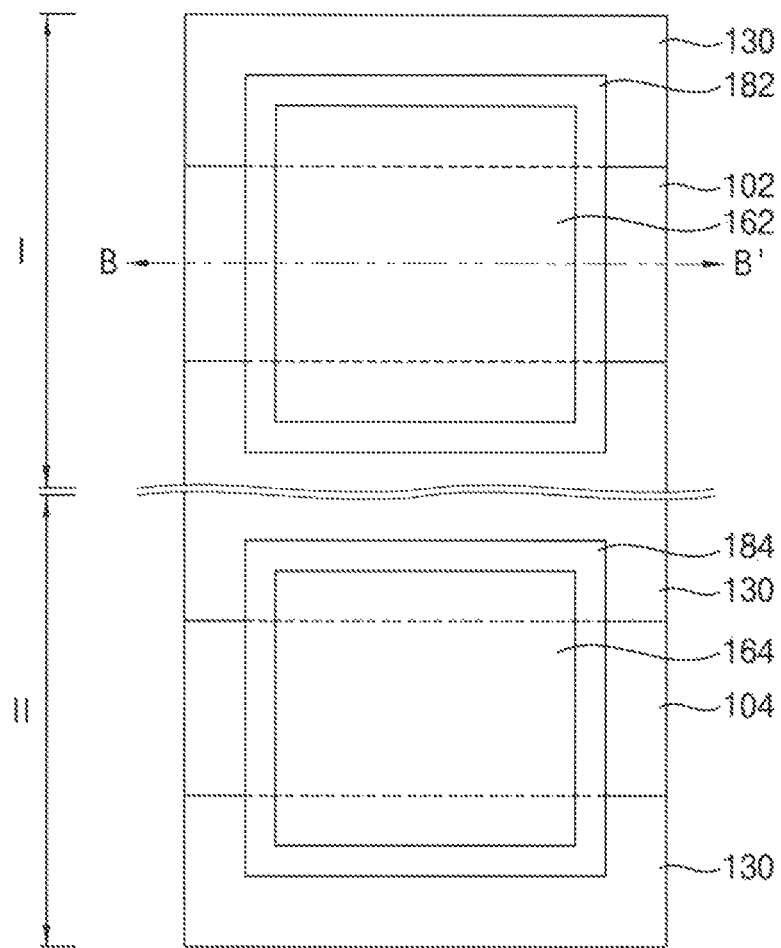
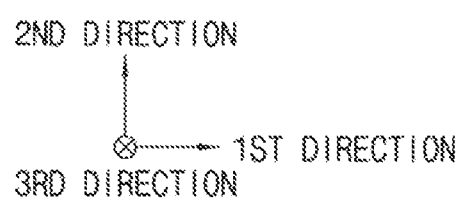

FIG. 13
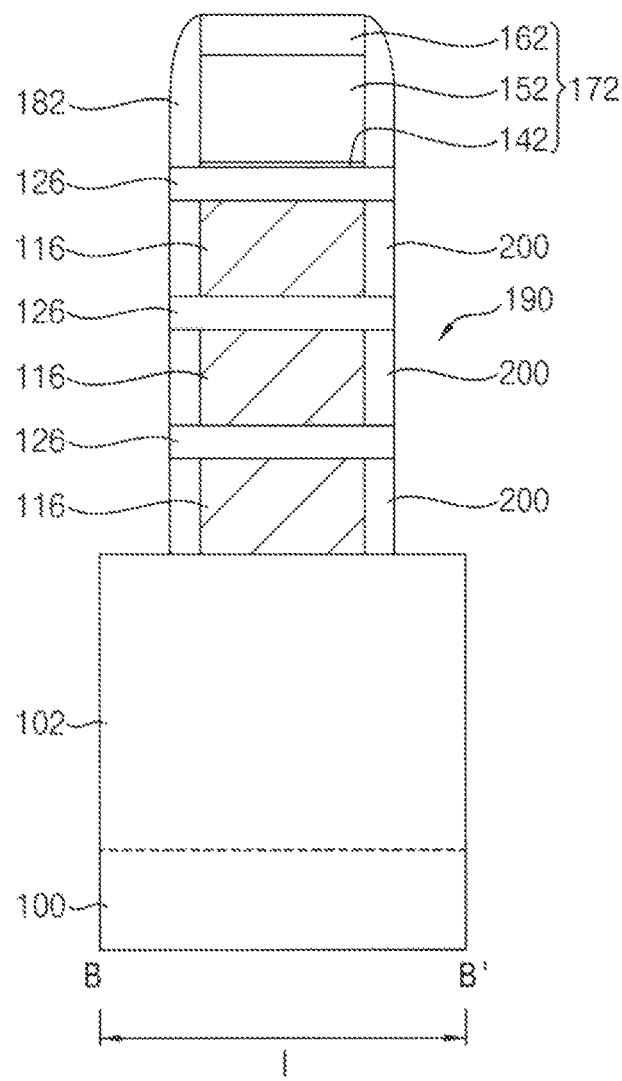
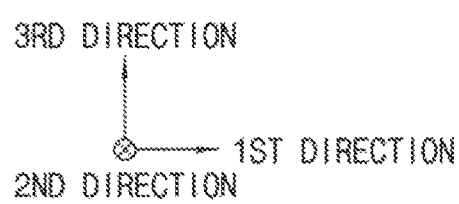

FIG. 14
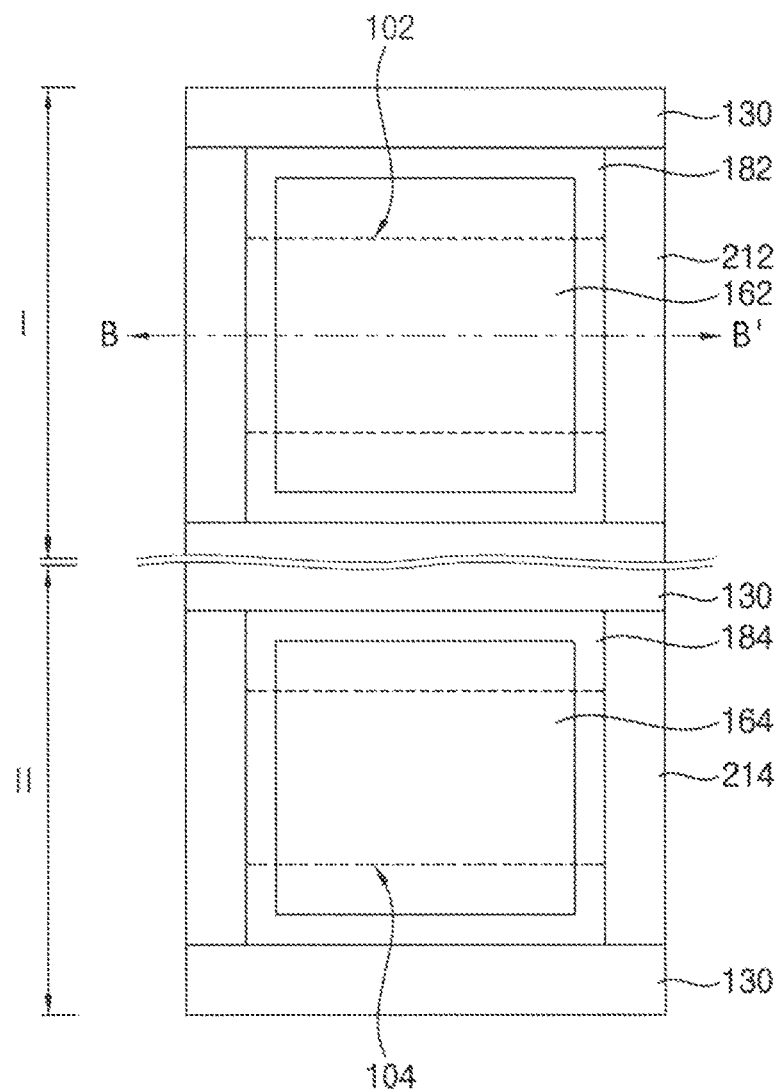
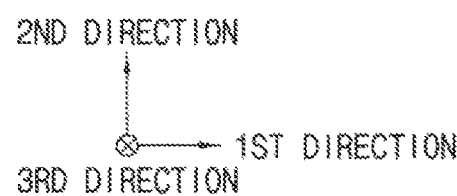

FIG. 15
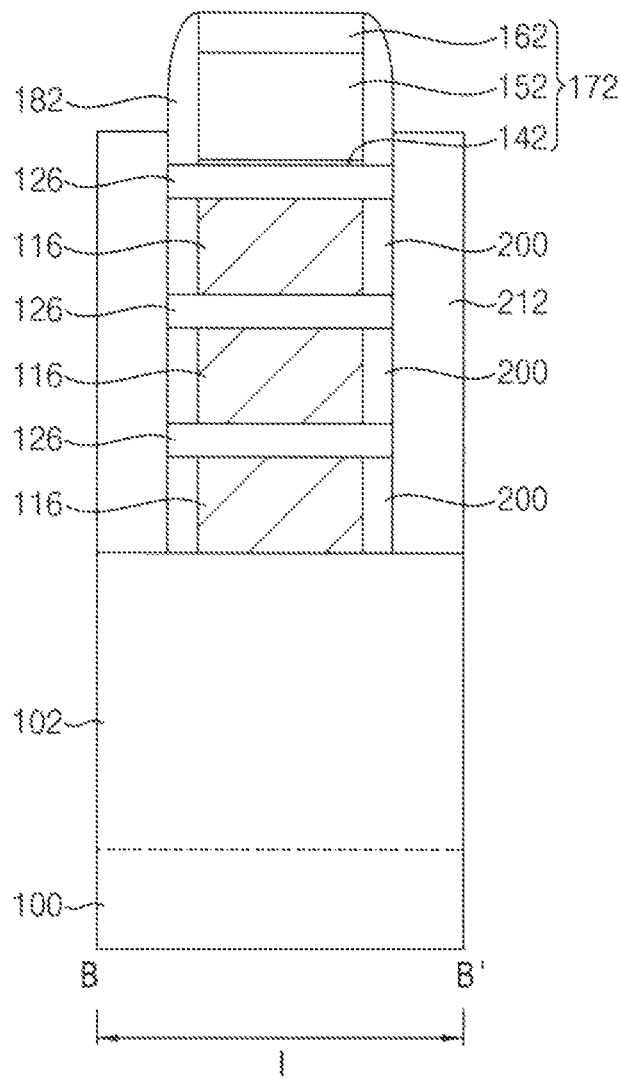
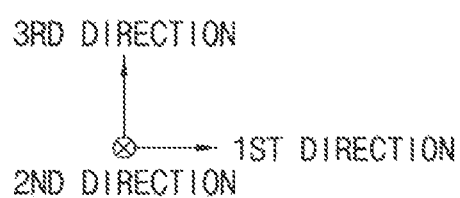

FIG. 17
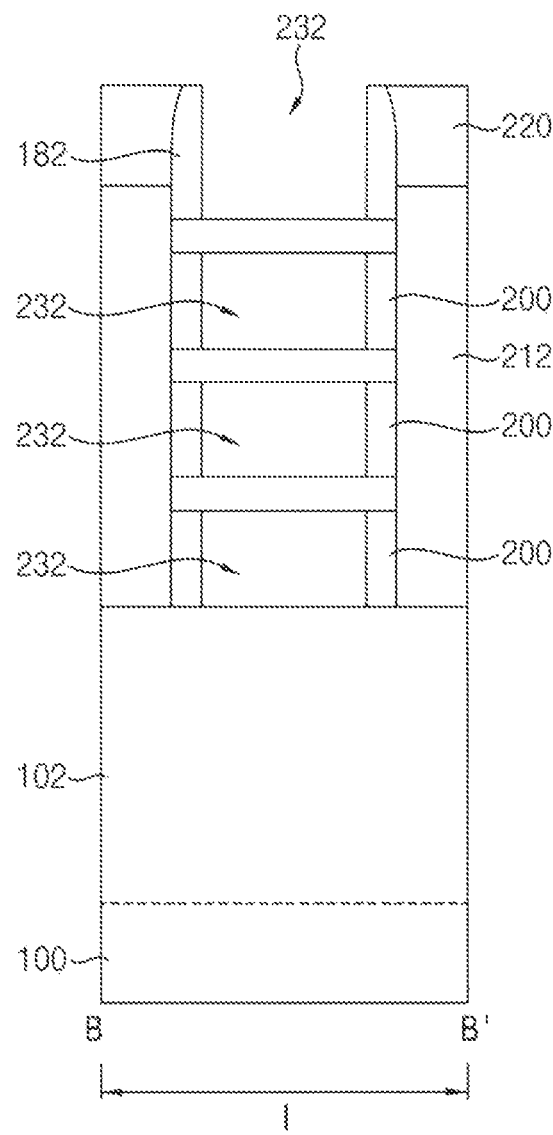
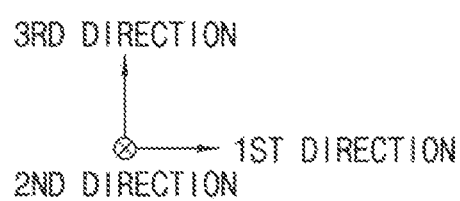

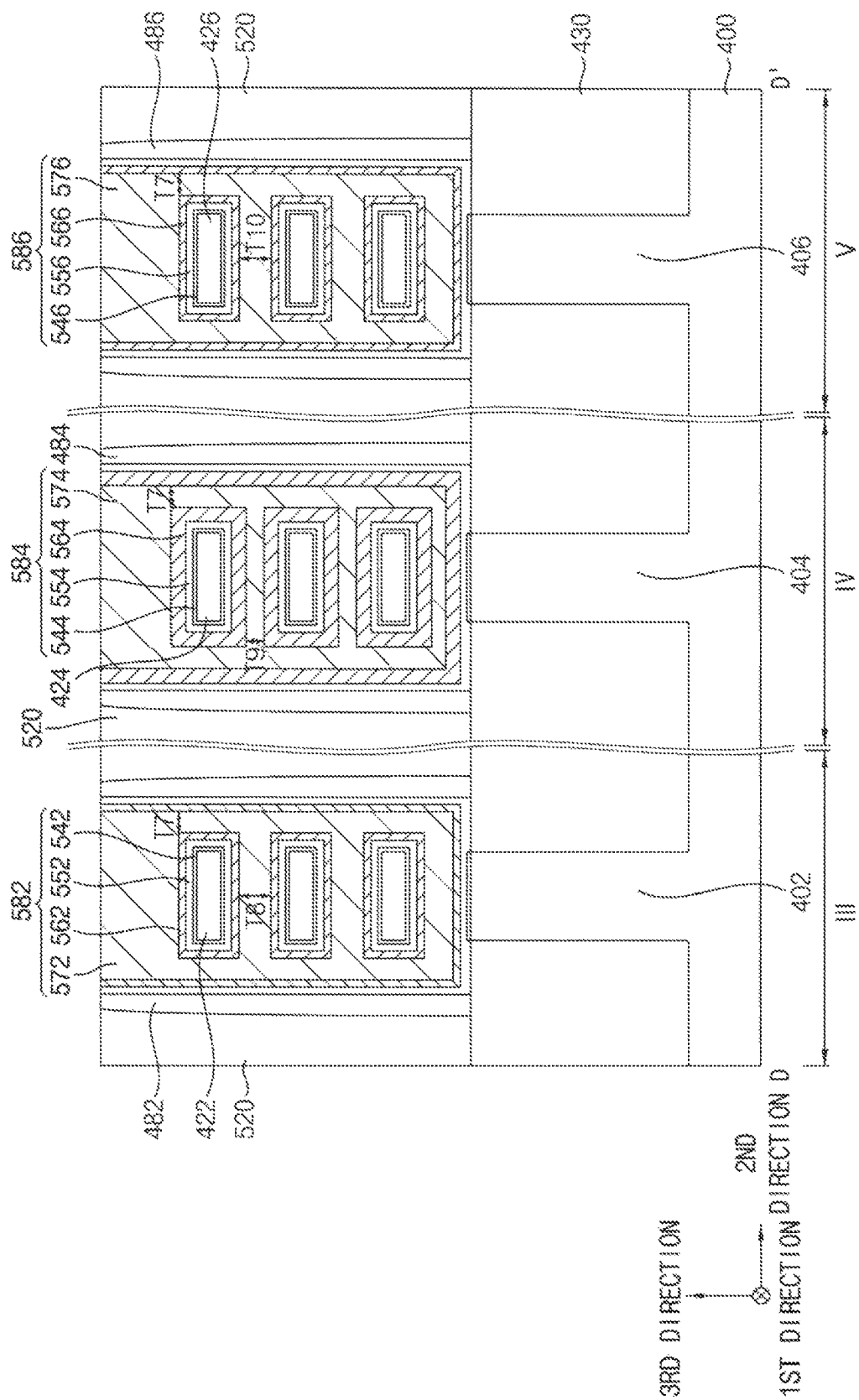

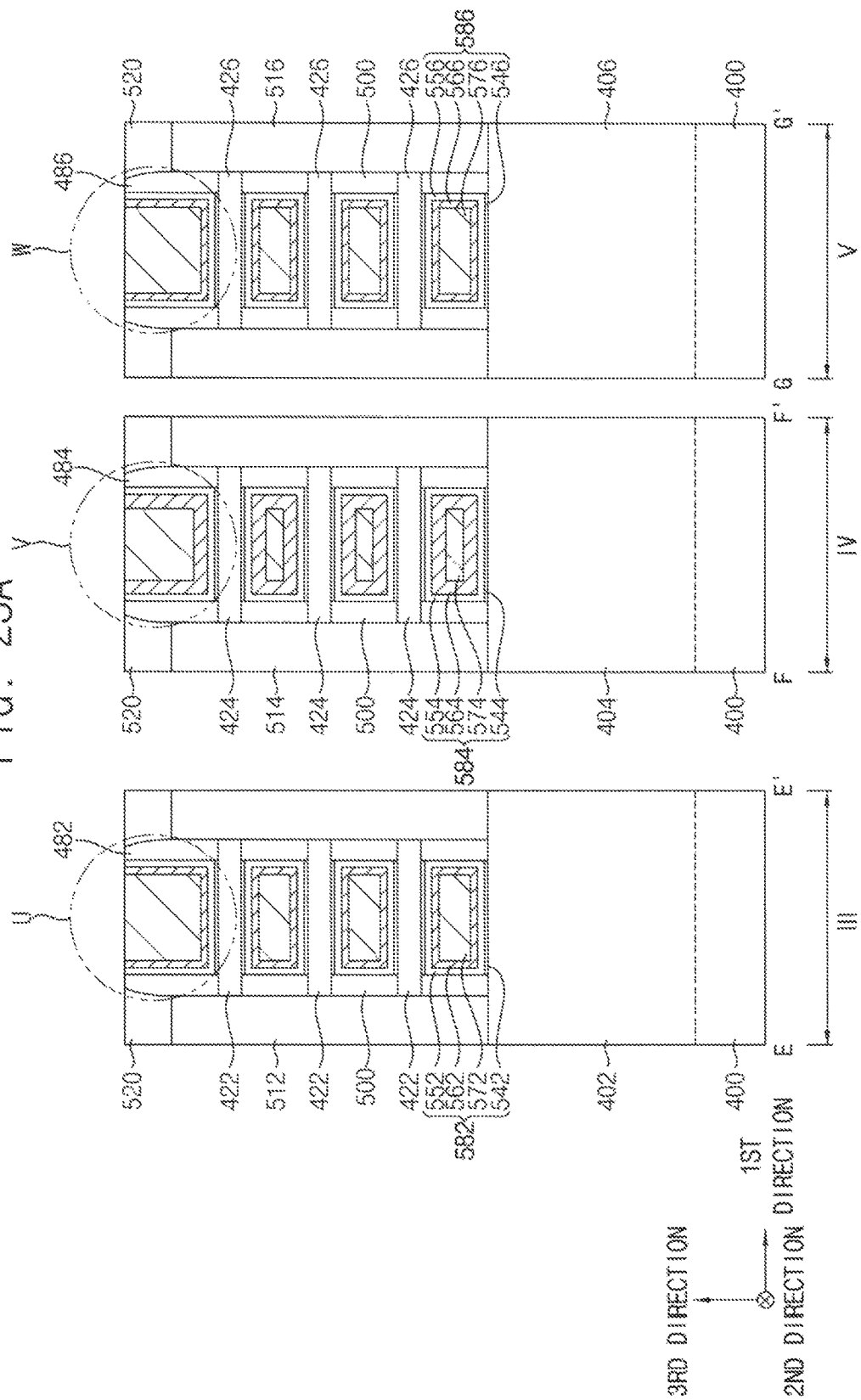

SEMICONDUCTOR DEVICES

CROSS-REFERENCE TO RELATED APPLICATION

This application claims priority under 35 USC § 119 to Korean Patent Application No. 10-2017-0119813, filed on Sep. 18, 2017 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices having vertically stacked channels.

2. Description of the Related Art

As the distance between channels in a multi-bridge-channel MOSFET (MBCFET) decreases, it may be difficult to control the thickness of a barrier layer to obtain a target threshold voltage of the MBCFET. It is desired to have a barrier layer having a relatively thicker thickness in an MBCFET having a relatively high threshold voltage, and thus, there may not be sufficient space for forming a workfunction metal layer, and a target threshold voltage may not be obtained.

SUMMARY

Example embodiments provide a semiconductor device having good characteristics to improve performance. More particularly, example embodiments provide a semiconductor device having good aluminum diffusion prevention characteristics.

According to example embodiments, there is provided a semiconductor device. The semiconductor device may include a first transistor and a second transistor. The first transistor may have a first threshold voltage, and include first channels on a substrate, first source/drain layers on the substrate, and a first gate structure surrounding the first channels. The first channels may be spaced apart from each other in a vertical direction on an upper surface of the substrate. The first source/drain layers may be connected to respective opposite sidewalls of the first channels. The first gate structure may include a first gate insulation pattern, a first threshold voltage control pattern, and a first workfunction metal pattern sequentially stacked from a surface of each of the first channels. The second transistor may have a second threshold voltage greater than the first threshold voltage, and include second channels on the substrate, second source/drain layers on the substrate, and a second gate structure surrounding the second channels. The second channels may be spaced apart from each other in the vertical direction on the upper surface of the substrate. The second source/drain layers may be connected to respective opposite sidewalls of the second channels. The second gate structure may include a second gate insulation pattern, a second threshold voltage control pattern, and a second workfunction metal pattern sequentially stacked from a surface of each of the second channels. A thickness of the second threshold voltage control pattern in a direction perpendicular to the upper surface of the substrate may be equal to or less than a thickness of the first threshold voltage control pattern in the direction perpendicular to the upper surface of the substrate.

According to example embodiments, there is provided a semiconductor device. The semiconductor device may include a first transistor, a second transistor, and a third transistor. The first transistor may have a positive first threshold voltage, and include first channels on a first region of a substrate including the first region and a second region, first source/drain layers on the first region of the substrate, and a first gate structure surrounding the first channels. The first channels may be spaced apart from each other in a vertical direction on an upper surface of the substrate. The first source/drain layers may be connected to respective opposite sidewalls of the first channels. The first gate structure may include a first gate insulation pattern, a first threshold voltage control pattern, and a first workfunction metal pattern sequentially stacked from a surface of each of the first channels. The second transistor may have a positive second threshold voltage greater than the positive first threshold voltage, and include second channels on the first region of the substrate, second source/drain layers on the first region of the substrate, and a second gate structure surrounding the second channels. The second channels may be spaced apart from each other in the vertical direction on the upper surface of the substrate. The second source/drain layers may be connected to respective opposite sidewalls of the second channels. The second gate structure may include a second gate insulation pattern, a second threshold voltage control pattern, and a second workfunction metal pattern sequentially stacked from a surface of each of the second channels. The third transistor may have a negative third threshold voltage, and include third channels on the second region of the substrate, third source/drain layers on the substrate, and a third gate structure surrounding the third channels. The third channels may be spaced apart from each other in the vertical direction on the upper surface of the substrate. The third source/drain layers may be connected to respective opposite sidewalls of the third channels. The third gate structure may include a third gate insulation pattern and a third threshold voltage control pattern sequentially stacked from a surface of each of the third channels. The first threshold voltage control pattern may have a first pattern having a first material composition, the second threshold voltage control pattern may have a second pattern having a second material composition different from the first material composition, and the third threshold voltage control pattern may have the first and second patterns.

According to example embodiments, there is provided a semiconductor device. The semiconductor device may include first channels on a substrate, a first gate structure surrounding the first channels, second channels on the substrate, and a second gate structure surrounding the second channels. The first channels may be spaced apart from each other in a vertical direction on an upper surface of the substrate. The first gate structure may include a first gate insulation pattern, a first threshold voltage control pattern, and a first workfunction metal pattern sequentially stacked from a surface of each of the first channels. The second channels may be spaced apart from each other in the vertical direction on the upper surface of the substrate and may be spaced apart from the first channels in a horizontal direction parallel to the upper surface of the substrate. The second gate structure may include a second gate insulation pattern, a second threshold voltage control pattern, and a second workfunction metal pattern sequentially stacked from a surface of each of the second channels. A second workfunction of the second gate structure may be greater than a first workfunction of the first gate structure, and a thickness of the second threshold voltage control pattern may be equal to or less than a thickness of the first threshold voltage control pattern.

According to example embodiments, there is provided a semiconductor device. The semiconductor device may include first channels on a substrate, a first gate structure surrounding the first channels, second channels on the substrate, and a second gate structure surrounding the second channels. The first channels may be spaced apart from each other in a vertical direction on an upper surface of the substrate. The first gate structure may include a first gate insulation pattern, a first threshold voltage control pattern, and a first workfunction metal pattern sequentially stacked from a surface of each of the first channels. The second channels may be spaced apart from each other in the vertical direction on the upper surface of the substrate and may be spaced apart from the first channels in a horizontal direction parallel to the upper surface of the substrate. The second gate structure may include a second gate insulation pattern, a second threshold voltage control pattern, and a second workfunction metal pattern sequentially stacked from a surface of each of the second channels. A second workfunction of the second gate structure may be greater than a first workfunction of the first gate structure, and a thickness in the vertical direction of a portion of the first work metal pattern between the first channels may be equal to or less than a thickness in the vertical direction of a portion of the second workfunction metal pattern between the second channels.

According to example embodiments, there is provided a semiconductor device. The semiconductor device may include first channels on a substrate, first source/drain layers on the substrate, and a first gate structure surrounding the first channels. The first channels may be spaced apart from each other in a vertical direction on an upper surface of the substrate. The first source/drain layers may be connected to respective opposite sidewalls of the first channels. The first gate structure may include a first gate insulation pattern, a first threshold voltage control pattern, and a first workfunction metal pattern sequentially stacked from a surface of each of the first channels. A thickness in the vertical direction of a portion of the first work metal pattern between the first channels may be less than a thickness in a horizontal direction parallel to the upper surface of the substrate of a portion of the first workfunction metal pattern stacked from a sidewall of the first threshold voltage control pattern.

In the semiconductor device in accordance with example embodiments, even if the vertical distances between channels of the MBCFET decrease, the MBCFET may have a target threshold voltage.

BRIEF DESCRIPTION OF THE DRAWINGS

Example embodiments will be more clearly understood from the following detailed description taken in conjunction with the accompanying drawings.

FIGS. 1, 2A, 2B, 3A and 3B are a plan view and cross-sectional views illustrating a first semiconductor device in accordance with example embodiments;

FIGS. 4 to 17 are plan views and cross-sectional views illustrating stages of a method of manufacturing a semiconductor device in accordance with example embodiments;

FIGS. 21, 22, 23A and 23B are a plan view and cross-sectional views illustrating a fifth semiconductor device in accordance with example embodiments;

DETAILED DESCRIPTION

Figure 2A:
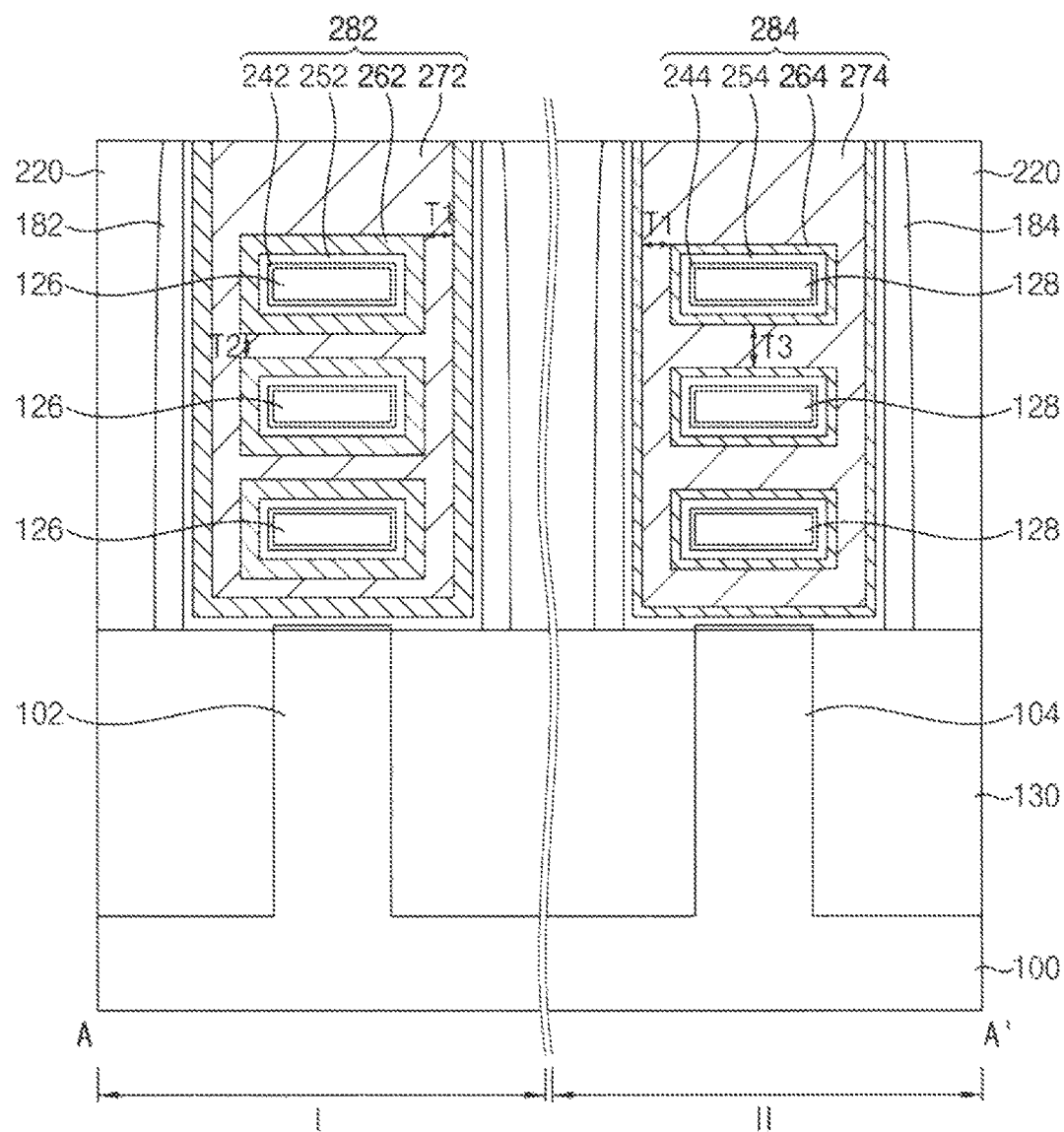
Figure 3A:
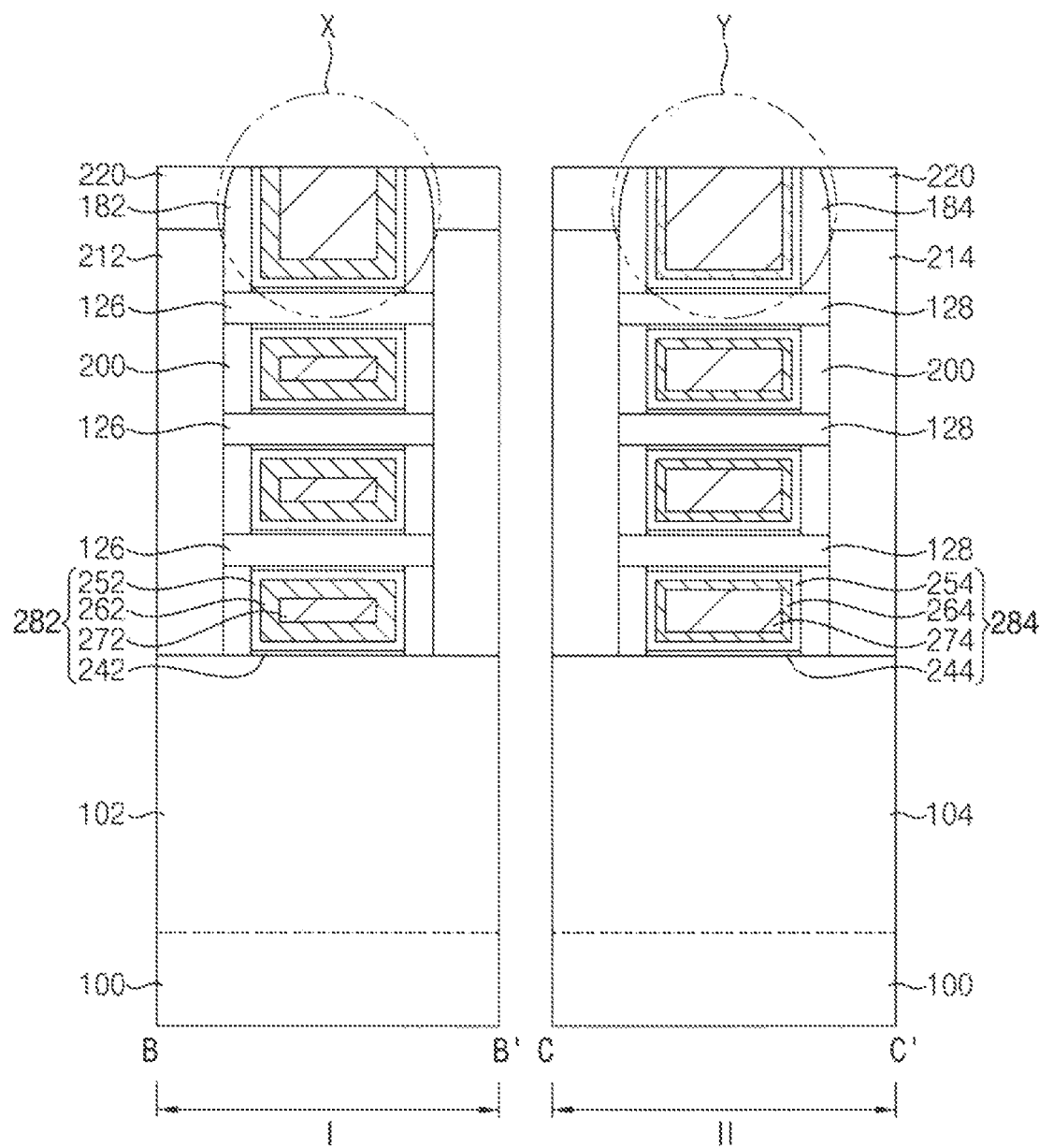
Figure 3B:
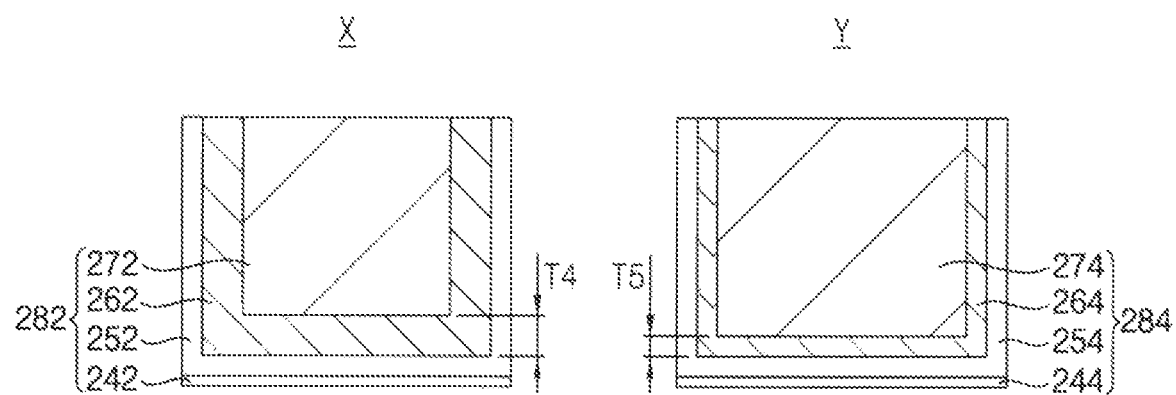

FIGS. 1, 2A, 2B, 3A and 3B are a plan view and cross-sectional views illustrating a first semiconductor device in accordance with example embodiments. Particularly, FIG. 1 is a plan view, FIGS. 2A and 2B are cross-sectional views taken along a line A-A' of FIG. 1, FIG. 3A is a cross-sectional view taken along lines B-B' and C-C' of FIG. 1, and FIG. 3B is an enlarged cross-sectional view of regions X and Y of FIG. 3A.

Hereinafter, two directions substantially parallel to an upper surface of a substrate 100 and crossing each other may be referred to as first and second directions, respectively, and a direction substantially perpendicular to the upper surface of the substrate 100 may be referred to as a third direction.

Referring to FIGS. 1, 2A, 2B, 3A and 3B, the first semiconductor device may include first and second semiconductor patterns 126 and 128, first and second epitaxial layers 212 and 214, and first and second gate structures 282 and 284 on the substrate 100. The first semiconductor device may further include first and second active fins 102 and 104, an isolation pattern 130, first and second gate spacers 182 and 184, an inner spacer 200, and an insulation layer 220.

As used herein, the first semiconductor device may be in the form of, for example, a semiconductor chip or die, formed from a semiconductor wafer. The term "semiconductor device" as used herein may also refer to a semiconductor package, including a package substrate, one or more semiconductor chips, and an encapsulant.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

The substrate 100 may include first and second regions I and II. The first region I may be a low voltage region to which a relatively low voltage may be applied, and the second region II may be a high voltage region to which a relatively high voltage may be applied.

The first and second active fins 102 and 104 may protrude from the first and second regions I and II of the substrate 100, respectively, in the third direction, and each of the first and second active fins 102 and 104 may extend in the first direction. In the figures, according to exemplary embodiments, one first active fin 102 and one second active fin 104 are shown on the first and second regions I and II, respectively, however, the inventive concepts are not limited thereto. Thus, a plurality of first active fins 102 may be spaced apart from each other in the second direction on the first region I, and a plurality of second active fins 104 may be spaced apart from each other in the second direction on the second region II.

Opposing sidewalls of the first and second active fins 102 and 104 may be covered by the isolation pattern 130. The first and second active fins 102 and 104 may include substantially the same material as that of the substrate 100, and the isolation pattern 130 may include an oxide, e.g., silicon oxide.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

A plurality of first semiconductor patterns 126 may be formed at a plurality of levels, respectively, to be spaced apart from each other in the third direction from an upper surface of the first active fin 102, and a plurality of second semiconductor patterns 128 may be formed at a plurality of levels, respectively, to be spaced apart from each other in the third direction from an upper surface of the second active fin 104. The levels at which the first and second semiconductor patterns 126 and 128 are formed may be positioned at the same heights. In the figures, according to exemplary embodiments, each of the first and second semiconductor patterns 126 and 128 is shown at three levels, however, the inventive concepts may not be limited thereto. As illustrated in the exemplary figures, according to example embodiments, the lowermost first semiconductor pattern of the plurality of first semiconductor patterns 126 may be positioned in the third direction (vertical direction) from an upper surface of the first active fin 102 at the same height as the corresponding lowermost second semiconductor pattern of the plurality of second semiconductor patterns 128 in the third direction (vertical direction) from an upper surface of the second active fin 104. As illustrated in the exemplary figures, according to example embodiments, the uppermost first semiconductor pattern of the plurality of first semiconductor patterns 126 may be positioned in the third direction (vertical direction) from an upper surface of the first active fin 102 at the same height as the corresponding uppermost second semiconductor pattern of the plurality of second semiconductor patterns 128 in the third direction (vertical direction) from an upper surface of the second active fin 104. As illustrated in the exemplary figures, according to example embodiments, the middle first semiconductor pattern of the plurality of first semiconductor patterns 126 may be positioned in the third direction (vertical direction) from an upper surface of the first active fin 102 at the same height as the corresponding middle second semiconductor pattern of the plurality of second semiconductor patterns 128 in the third direction (vertical direction) from an upper surface of the second active fin 104.

In the figures, according to exemplary embodiments, only one first semiconductor pattern 126 is shown at each level on the first active fin 102 and only one second semiconductor pattern 128 is shown at each level on the second active fin 104, however, the inventive concepts may not be limited thereto. Thus, a plurality of first semiconductor patterns 126 may be formed to be spaced apart from each other in the first direction at each level on the first active fin 102, and a plurality of second semiconductor patterns 128 may be formed to be spaced apart from each other in the first direction at each level on the second active fin 104.

In example embodiments, the first and second semiconductor patterns 126 and 128 may be nanosheets including a semiconductor material, e.g., silicon, germanium, etc. Alternatively, the first and second semiconductor patterns 126 and 128 may be nanowires including a semiconductor material.

In example embodiments, the first and second semiconductor patterns 126 and 128 may serve as channels of first and second transistors, respectively, which may be referred to as first and second channels, respectively.

The first epitaxial layer 212 may extend in the third direction from the upper surface of the first active fin 102, and may commonly contact respective sidewalls of the first semiconductor patterns 126 at the plurality of levels to be connected thereto. An upper portion of the first epitaxial layer 212 may contact a lower sidewall of the first gate spacer 182. The second epitaxial layer 214 may extend in the third direction from the upper surface of the second active fin 104, and may commonly contact respective sidewalls of the second semiconductor patterns 128 at the plurality of levels to be connected thereto. An upper portion of the second epitaxial layer 214 may contact a lower sidewall of the second gate spacer 184.

In example embodiments, each of the first and second epitaxial layers 212 and 214 may include single crystalline silicon carbide doped with n-type impurities or single crystalline silicon doped with n-type impurities, and thus may serve as a source/drain layer of an NMOS transistor. Alternatively, each of the first and second epitaxial layers 212 and 214 may include single crystalline silicon-germanium doped with p-type impurities, and thus may serve as a source/drain layer of a PMOS transistor. The first and second epitaxial layers 212 and 214 may serve as first and second source/drain layers, respectively.

The first and second gate structures 282 and 284 may be formed on the first and second regions I and II, respectively, of the substrate 100, and may surround the first and second semiconductor patterns 126 and 128, respectively. In the figures, according to exemplary embodiments, the first gate structure 282 is shown to cover the first semiconductor pattern 126 on one first active fin 102, and the second gate structure 284 is shown to cover the second semiconductor pattern 128 on one second active fin 104, however, the inventive concepts may not be limited thereto. For example, each of the first and second gate structures 282 and 284 may extend in the second direction, and the first gate structure 282 may cover the first semiconductor patterns 126 on a plurality of first active fins 102, and the second gate structure 284 may cover the second semiconductor patterns 128 on a plurality of second active fins 104.

In the figure, according to exemplary embodiments, one first gate structure 282 is shown on the first region I of the substrate 100, and one second gate structure 284 is shown on the second region II of the substrate 100, however, the inventive concepts may not be limited thereto. Thus, a plurality of first gate structures 282 may be formed on the first region I of the substrate 100, and a plurality of second gate structures 284 may be formed on the second region II of the substrate 100.

The first and second gate spacers 182 and 184 may cover upper sidewalls in the first direction and sidewalls in the second direction of the first and second gate structures 282 and 284, respectively, and the inner spacer 200 may be formed between lower sidewalls in the first direction of the first and second gate structures 282 and 284, respectively, and the first and second epitaxial layers 212 and 214, respectively.

The first and second gate spacers 182 and 184 may include a nitride, e.g., silicon nitride, the inner spacer 200 may include an oxide, e.g., silicon oxide. In an example embodiment, a thickness of the inner spacer 200 in the first direction may be equal to that of each of the first and second gate spacers 182 and 184 in the first direction.

The first gate structure 282 may include a first gate insulation pattern, a first threshold voltage control pattern 262, and a first workfunction metal pattern 272 sequentially stacked from a surface of each of the first semiconductor patterns 126, and the first gate insulation pattern may include a first interface pattern 242 and a first high-k dielectric pattern 252 sequentially stacked.

The first interface pattern 242 may be formed on the upper surface of the first active fin 102 and the surfaces of the first semiconductor patterns 126, and the first high-k dielectric pattern 252 may be formed on a surface of the first interface pattern 242, an inner sidewall of the inner spacer 200, and an inner sidewall of the first gate spacer 182. The first threshold voltage control pattern 262 may be formed on the first high-k dielectric pattern 252, and the first workfunction metal pattern 272 may fill a space between the first semiconductor patterns 126 spaced apart from each other in the third direction and a space defined by an inside of the first gate spacer 182 on an uppermost one of the first semiconductor patterns 126.

The first interface pattern 242 may include an oxide, e.g., silicon oxide, and the first high-k dielectric pattern 252 may include, e.g., hafnium oxide, tantalum oxide, zirconium oxide, etc.

The first threshold voltage control pattern 262 may include, e.g., titanium nitride, titanium oxynitride, titanium oxycarbonitride, titanium silicon nitride, titanium silicon oxynitride, titanium aluminum oxynitride, tantalum nitride, tantalum oxynitride, tantalum aluminum nitride, tantalum aluminum oxynitride, tungsten nitride, tungsten carbonitrde, aluminum oxide, etc. The first workfunction metal pattern 272 may include, e.g., titanium aluminum, titanium aluminum oxide, titanium aluminum carbide, titanium aluminum nitride, titanium aluminum oxynitride, titanium aluminum carbonitrde, titanium aluminum oxycarbonitride, etc.

The first gate structure 282 together with the first epitaxial layer 212 serving as a source/drain layer and the first semiconductor pattern 126 serving as a channel may form a first transistor. The first transistor may be an NMOS transistor or a PMOS transistor according to the conductivity type of the impurities doped in the first epitaxial layer 212. The first transistor may include the plurality of first semiconductor patterns 126 sequentially stacked in the third direction, and thus may be an MBCFET.

The first transistor may have a first threshold voltage, which may be obtained by the first workfunction metal pattern 272 and the first threshold voltage control pattern 262. For example, when the first workfunction metal pattern 272 includes titanium aluminum carbide and the first threshold voltage control pattern 262 includes titanium nitride, the first threshold voltage control pattern 262 may prevent or reduce the diffusion of aluminum in the first workfunction metal pattern 272, and the degree of diffusion of aluminum may be controlled by the thickness of the first threshold voltage control pattern 262 so that the first threshold voltage may be obtained.

The second gate structure 284 may include a second gate insulation pattern, a second threshold voltage control pattern 264, and a second workfunction metal pattern 274 sequentially stacked from a surface of each of the second semiconductor patterns 128, and the second gate insulation pattern may include a second interface pattern 244 and a second high-k dielectric pattern 254 sequentially stacked.

The second interface pattern 244, the second high-k dielectric pattern 254, and the second workfunction metal pattern 274 may include substantially the same material compositions as those of the first interface pattern 242, the first high-k dielectric pattern 252, and the first workfunction control pattern 264, respectively. The second threshold voltage control pattern 264 may include the above-mentioned materials of the first threshold voltage control pattern 262.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second gate structure 284 together with the second epitaxial layer 214 serving as a source/drain layer and the second semiconductor pattern 128 serving as a channel may form a second transistor. The second transistor may be an NMOS transistor or a PMOS transistor according to the conductivity type of the impurities doped in the second epitaxial layer 214. The second transistor may include the plurality of second semiconductor patterns 128 sequentially stacked in the third direction, and thus may be an MBCFET.

The second transistor may have a second threshold voltage, which may be obtained by the second workfunction metal pattern 274 and the second threshold voltage control pattern 264.

In example embodiments, each of the first and second channels may be a nanosheet, and each of a distance between the first channels and a distance between the second channels is equal to or less than about 10 nm.

In example embodiments, each of the first and second transistors may be an NMOS transistor. The second threshold voltage of the second transistor may be higher than the first threshold voltage of the first transistor. A second workfunction of the second gate structure 284 including the second workfunction metal pattern 274 and the second threshold voltage control pattern 264 may be higher than that of the first gate structure 282 including the first workfunction metal pattern 272 and the first threshold voltage control pattern 262. Thus, when the first and second workfunction metal patterns 272 and 274 include the same material compositions and the first and second threshold voltage control patterns 262 and 264 include the same material compositions, generally, a thickness of the second threshold voltage control pattern 264 is more than that of the first threshold voltage control pattern 262.

As illustrated in FIG. 3B, in example embodiments, the first and second threshold voltage control patterns 262 and 264 may include different material compositions, and a fifth thickness T5 of the second threshold voltage control pattern 264 may be equal to or less than a fourth thickness T4 of the first threshold voltage control pattern 262. As illustrated in FIG. 3B, the fourth thickness T4 of the first threshold voltage control pattern 262 may be uniform in a direction perpendicular to an upper surface of the substrate 100 and in a direction parallel to the upper surface of the substrate 100. Likewise, the fifth thickness T5 of the second threshold voltage control pattern 264 may be uniform in a direction perpendicular to an upper surface of the substrate 100 and in a direction parallel to the upper surface of the substrate 100. In an example embodiment, the first and second threshold voltage control patterns 262 and 264 may include titanium nitride and titanium silicon nitride, respectively, and the characteristics of the second threshold voltage control pattern 264 including titanium silicon nitride for preventing the diffusion of aluminum may be greater than those of the firs threshold voltage control pattern 262 including titanium nitride for preventing the diffusion of aluminum. Accordingly, even if the second threshold voltage control pattern 264 of the second transistor has a relatively thinner thickness compared to that of the first threshold voltage control pattern 262, the relatively high threshold voltage may be obtained by the second threshold voltage control pattern 264.

In example embodiments, a distance between neighboring ones of the first semiconductor patterns 126 sequentially stacked in the third direction or a distance between neighboring ones of the second semiconductor patterns 128 sequentially stacked in the third direction may be less than about 10 nm. As the distance between channels sequentially stacked in the third direction decreases, the threshold voltage control pattern and the workfunction metal pattern may not have sufficiently thick thicknesses between the channels. For example, in order to obtain the second threshold voltage having a relatively high value, conventionally, the second threshold voltage control pattern 264 may need a relatively thicker thickness, and thus there may not be sufficient spaces for forming the second workfunction metal pattern 274.

However, in example embodiments, the second threshold voltage control pattern 264 may include a material having relatively high diffusion prevention characteristics when compared to those of the first threshold voltage control pattern 262, and thus a relatively high threshold voltage may be obtained even with a relatively thinner thickness compared to that of the first threshold voltage control pattern 262, and the second workfunction metal pattern 274 may have a sufficiently thicker thickness compared to that of the first workfunction metal pattern 272.

In FIG. 2A, a third thickness T3 in a vertical direction of a portion of the second workfunction metal pattern 274 between the second semiconductor patterns 128 in the second transistor is greater than a second thickness T2 in the vertical direction of a portion of the first workfunction metal pattern 272 between the first semiconductor patterns 126 in the first transistor.

As the distance between the channels decreases, the second thickness T2 in the vertical direction of the portion of the first workfunction metal pattern 272 between the first semiconductor patterns 126 in the first transistor is less than twice the first thickness T1 in a horizontal direction of a portion of the first workfunction metal pattern 272 stacked in the second direction from the sidewall of the first threshold voltage control pattern 262 in FIG. 2A. FIG. 2B shows the second thickness T2 in the vertical direction of the portion of the first workfunction metal pattern 272 between the first semiconductor patterns 126 in the first transistor is less than the first thickness T1 in the horizontal direction of the portion of the first workfunction metal pattern 272 stacked in the second direction from the sidewall of the first threshold voltage control pattern 262.

The third thickness T3 in the vertical direction of the portion of the second workfunction metal pattern 274 between the second semiconductor patterns 128 in the second transistor is equal to or more than twice the first thickness T1 in the horizontal direction of a portion of the second workfunction metal pattern 274 stacked in the second direction from the sidewall of the second threshold voltage control pattern 264 in FIG. 2A.

The insulation layer 220 may surround the sidewalls of the first and second gate spacers 182 and 184 and cover the first and second epitaxial layers 212 and 214. The insulation layer 220 may include an oxide, e.g., silicon oxide.

The first semiconductor device may further include contact plugs (not shown), wirings (not shown) or wiring patterns, etc., electrically connected to the first and second epitaxial layers 212 and 214. Contact plugs may be, for example, conductive plugs formed of a conductive material such as a metal. The wiring patterns described above may also be formed of a conductive material, for example, a metal, and each may be formed horizontally within the die.

FIGS. 4 to 17 are plan views and cross-sectional views illustrating stages of a method of manufacturing a semiconductor device in accordance with example embodiments. Particularly, FIGS. 4, 6, 8, 11, 14, and 16 are plan views, and FIGS. 5, 7, 9-10, 12-13, 15, and 17 are cross-sectional views.

Figure 7:
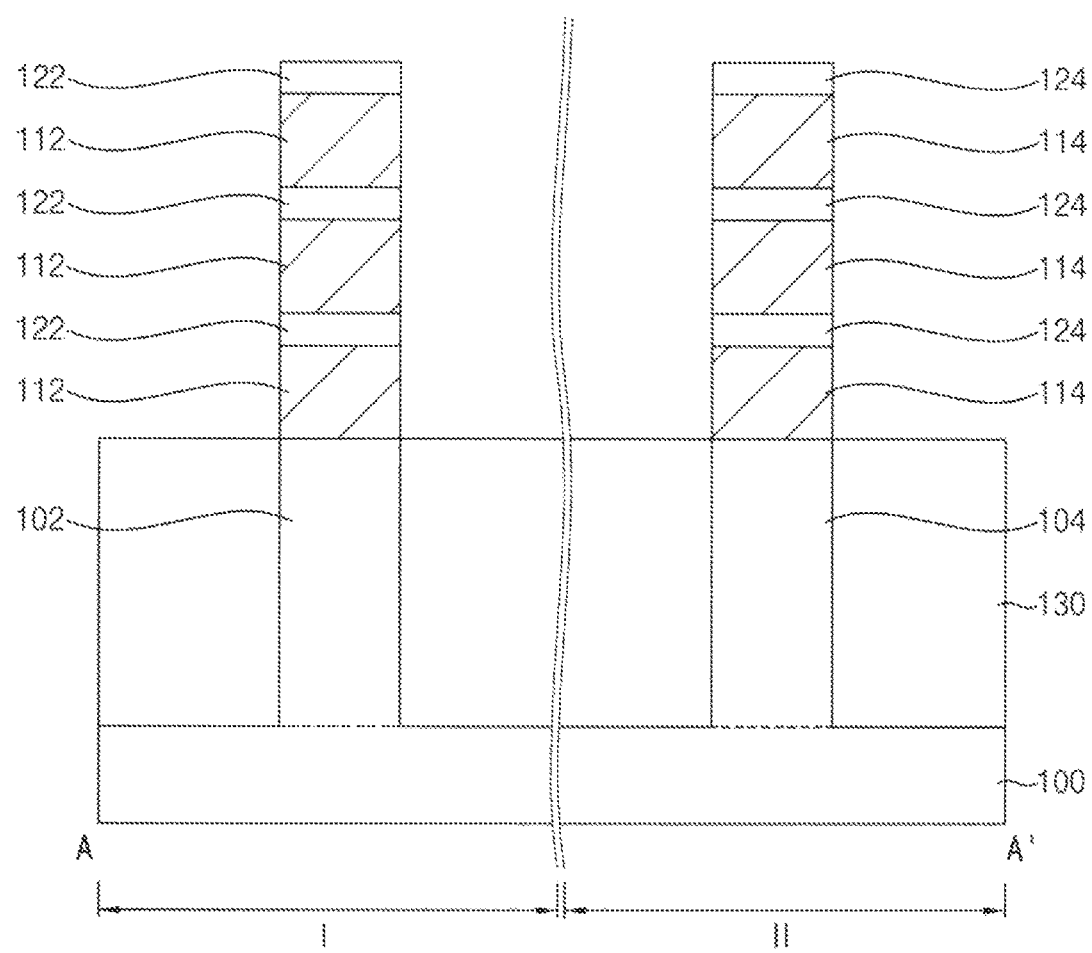
Figure 9:
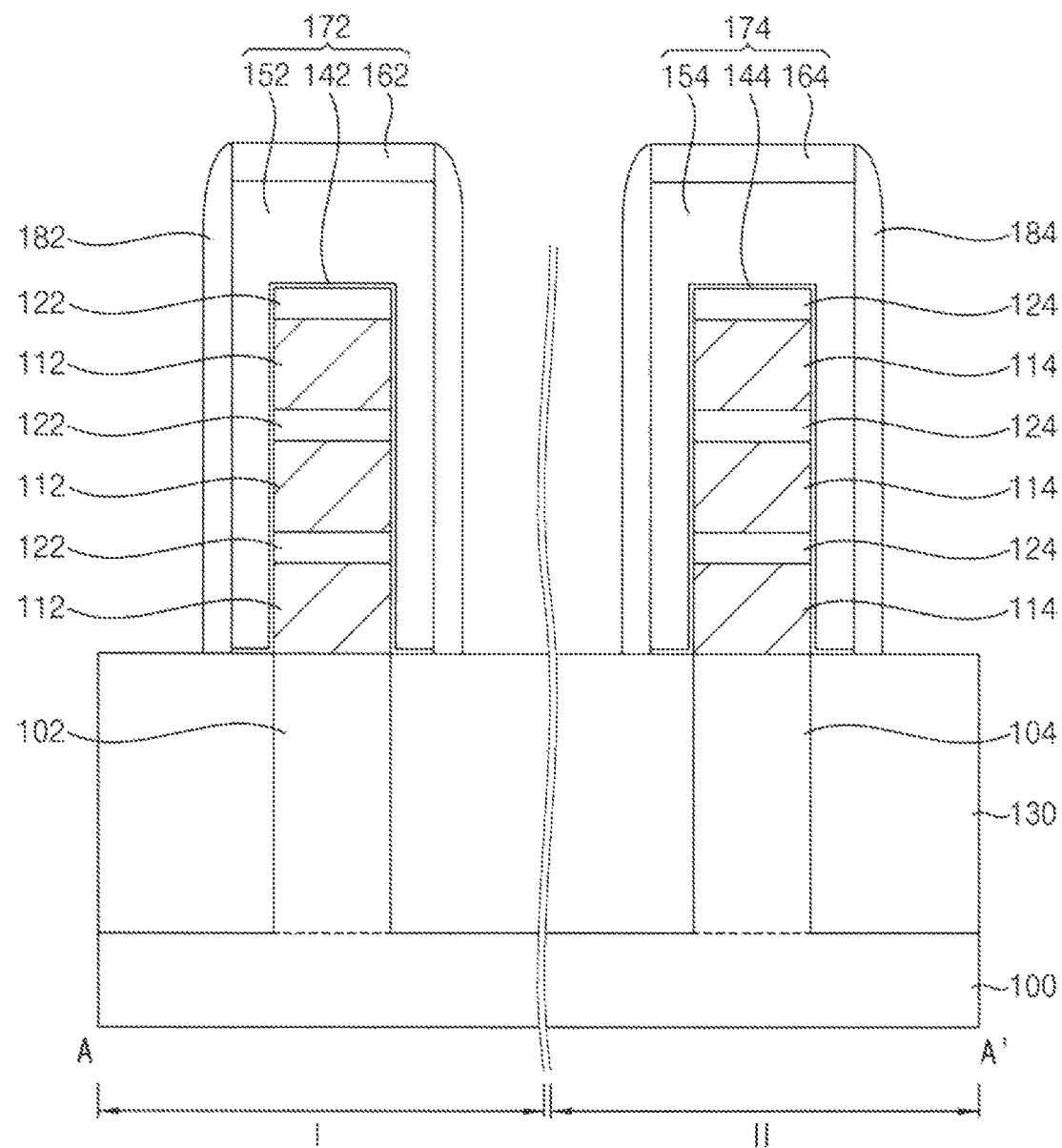

FIGS. 5, 7, and 9 are cross-sectional views taken along lines A-A' of corresponding plan views, respectively, FIGS. 10, 12, 13, 15, and 17 are cross-sectional views taken along lines B-B' of corresponding plan views, respectively.

Figure 4:
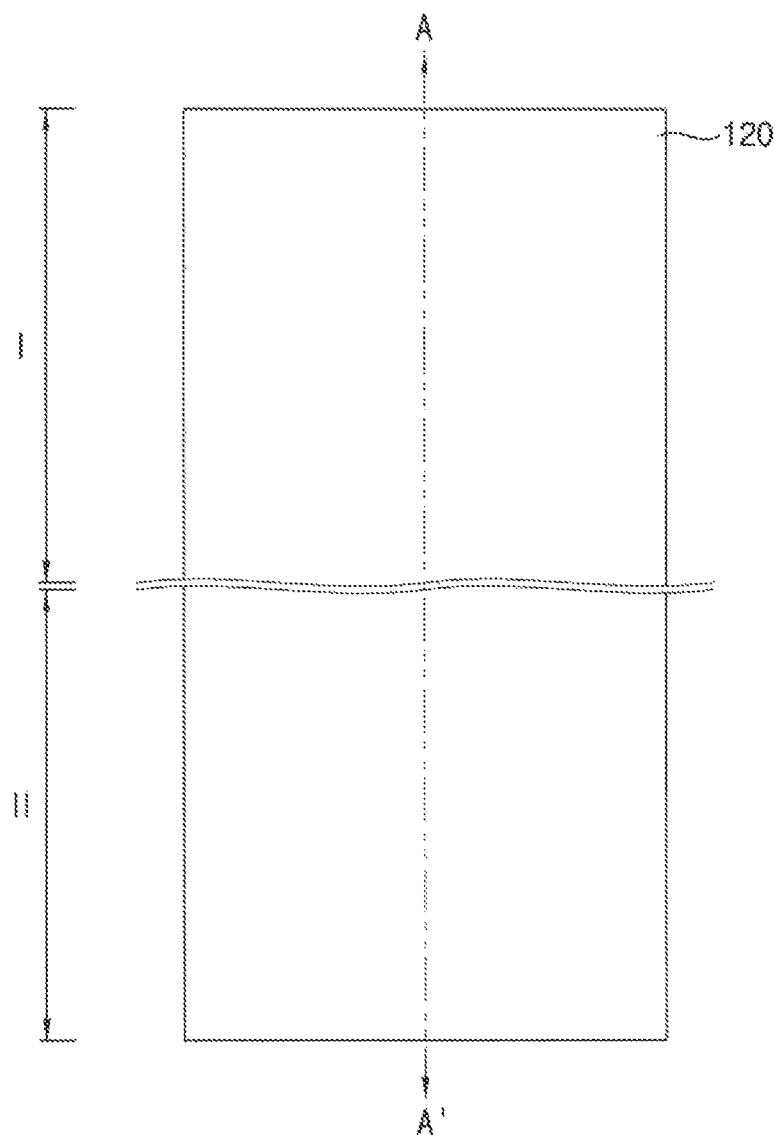

Referring to FIGS. 4 and 5, a sacrificial layer 110 and a semiconductor layer 120 may be alternately stacked on a substrate 100 including first and second regions I and II.

In the figures, according to exemplary embodiments, three sacrificial layers 110 and three semiconductor layers 120 are shown to be formed on the substrate 100, however, the inventive concepts may not be limited thereto.

The sacrificial layer 110 may include a material having an etching selectivity with respect to the substrate 100 and the semiconductor layer 120, which may include, e.g., silicon-germanium.

Figure 6:
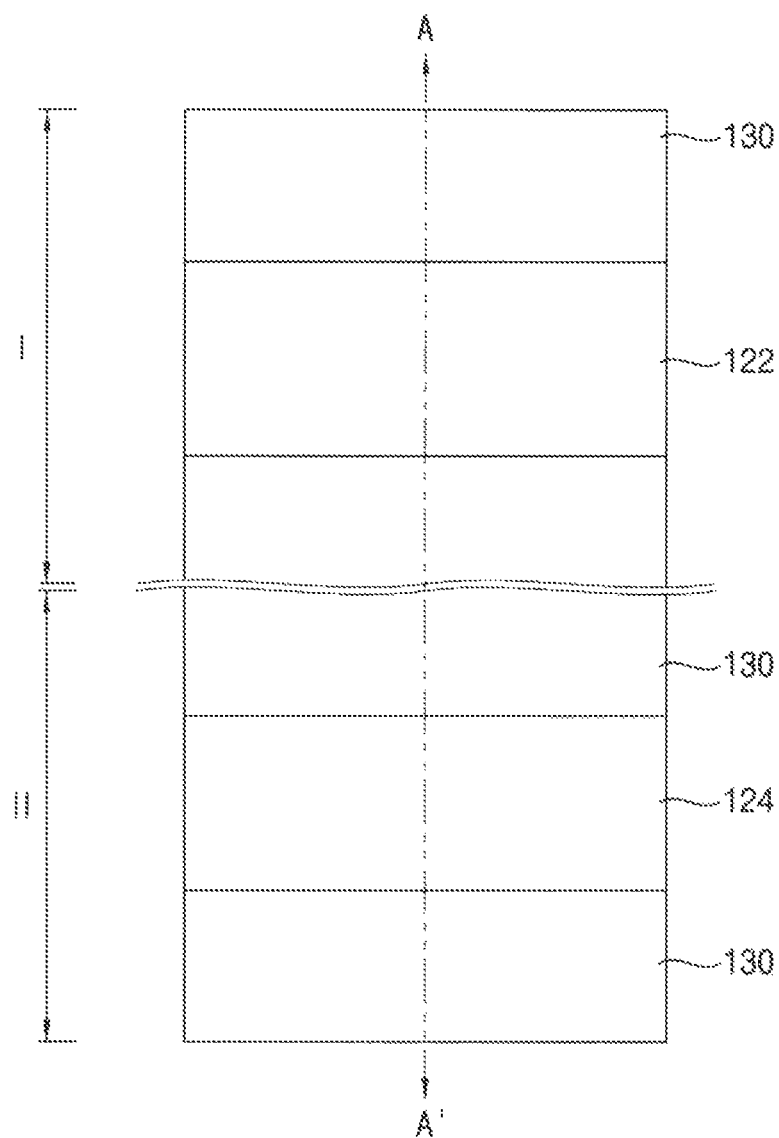

Referring to FIGS. 6 and 7, a photoresist pattern may be formed on an uppermost one of the semiconductor layers 120 to extend in the first direction, and the semiconductor layers 120, the sacrificial layers 110, and an upper portion of the substrate 100 may be etched using the photoresist pattern as an etching mask.

Thus, a first active fin 102, a first sacrificial line 112, and a first semiconductor line 122 each of which may extend in the first direction may be formed on the first region I of the substrate 100, and a second active fin 104, a second sacrificial line 114, and a second semiconductor line 124 each of which may extend in the first direction may be formed on the second region II of the substrate 100.

After removing the photoresist pattern, an isolation pattern 130 may be formed on the first and second regions I and II of the substrate 100 to cover sidewalls of the first and second active fins 102 and 104.

Hereinafter, the first sacrificial lines 112 and the first semiconductor lines 122, each of which may extend in the first direction, sequentially stacked on an upper surface of the first active fin 102 may be referred to as a first structure, and the second sacrificial lines 114 and the second semiconductor lines 124, each of which may extend in the first direction, sequentially stacked on an upper surface of the second active fin 104 may be referred to as a second structure.

In example embodiments, a plurality of first structures may be formed to be spaced apart from each other in the second direction on the first region I of the substrate 100, and a plurality of second structures may be formed to be spaced apart from each other in the second direction on the second region II of the substrate 100.

Figure 8:
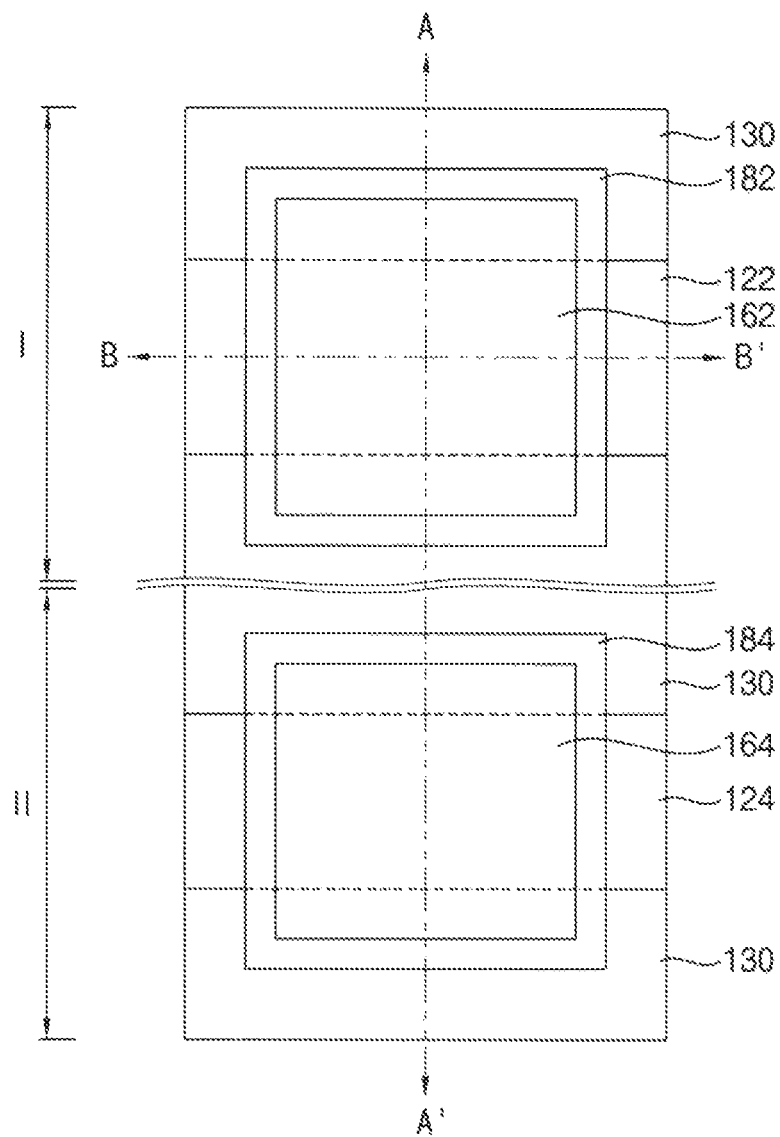

Referring to FIGS. 8 to 10, a first dummy gate structure 172 may be formed on the first region I of the substrate 100 to partially cover the first structure and the isolation pattern 130, and a second dummy gate structure 174 may be formed on the second region II of the substrate 100 to partially cover the second structure and the isolation pattern 130.

Particularly, a dummy gate insulation layer, a dummy gate electrode layer, and a dummy gate mask layer may be sequentially formed on the substrate 100 having the first and second structures and the isolation pattern 130 thereon, a photoresist pattern may be formed on the dummy gate mask layer, and the dummy gate mask layer may be etched using the photoresist pattern as an etching mask to form first and second dummy gate masks 162 and 164 on the first and second regions I and II, respectively, of the substrate 100. The dummy gate insulation layer may include an oxide, e.g., silicon oxide, the dummy gate electrode layer may include, e.g., polysilicon, and the dummy gate mask layer may include a nitride, e.g., silicon nitride.

The dummy gate electrode layer and the dummy gate insulation layer may be etched using the first and second dummy gate masks 162 and 164 as an etching mask to form a first dummy gate electrode 152 and a first dummy gate insulation pattern 142, respectively, on the first region I of the substrate 100 and to form a second dummy gate electrode 154 and a second dummy gate insulation pattern 144, respectively, on the second region II of the substrate 100.

The first dummy gate insulation pattern 142, the first dummy gate electrode 152, and the first dummy gate mask 162 sequentially stacked on the first active fin 102 and a portion of the isolation pattern 130 adjacent thereto may form the first dummy gate structure 172, and the second dummy gate insulation pattern 144, the second dummy gate electrode 154, and the second dummy gate mask 164 sequentially stacked on the second active fin 104 and a portion of the isolation pattern 130 adjacent thereto may form the second dummy gate structure 174.

In example embodiments, the first and second dummy gate structures 172 and 174 may extend in the second direction to cover sidewalls in the second direction of the first and second structures, respectively.

First and second gate spacers 182 and 184 may be formed on sidewalls of the first and second dummy gate structures 172 and 174, respectively.

Particularly, a gate spacer layer may be formed on the substrate 100 having the first and second structures, the isolation pattern 130, and the first and second dummy gate structures 172 and 174 thereon, and may be anisotropically etched to form the first and second gate spacers 182 and 184, respectively.

Figure 12:
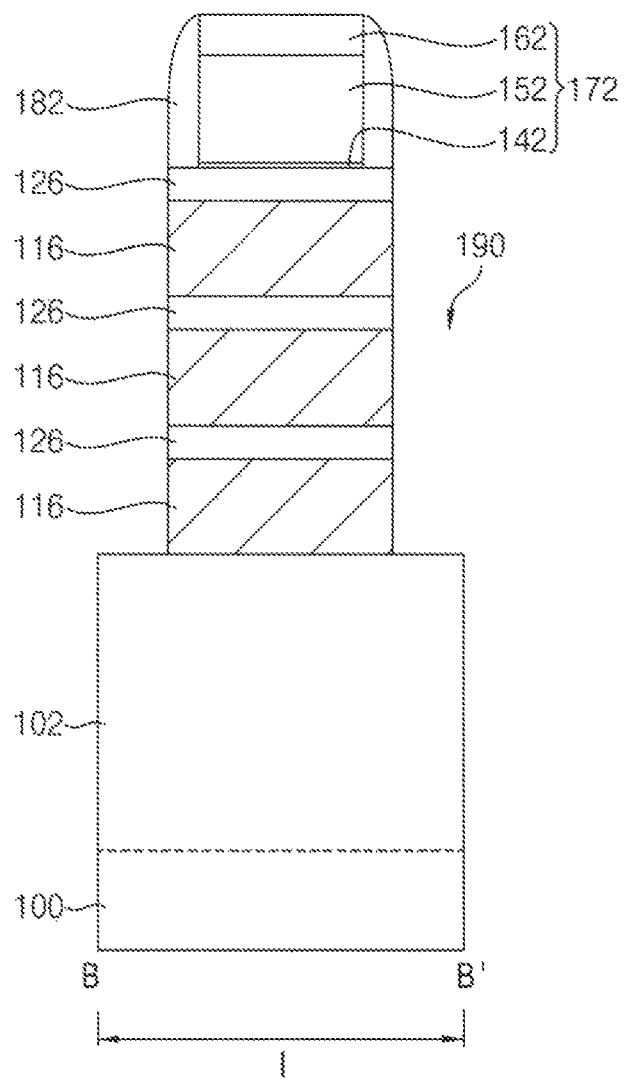

Referring to FIGS. 11 and 12, the first and second structures may be etched using the first and second dummy gate structures 172 and 174, and the first and second gate spacers 182 and 184 as an etching mask to form third and fourth structures, respectively.

The third structure may include first sacrificial patterns 116 and first semiconductor patterns 126 alternately stacked on the upper surface of the first active fin 102 on the first region I of the substrate 100, and a plurality of third structures may be formed to be spaced apart from each other in each of the first and second directions. Likewise, the fourth structure may include second sacrificial patterns (not shown) and second semiconductor patterns 128 (refer to FIGS. 2A and 3A) alternately stacked on the upper surface of the second active fin 104 on the second region II of the substrate 100, and a plurality of fourth structures may be formed to be spaced apart from each other in each of the first and second directions.

Hereinafter, the first dummy gate structure 172, the first gate spacer 182 on the sidewall of the first dummy gate structure 172, and the third structure may be referred to as a fifth structure, and the second dummy gate structure 174, the second gate spacer 184 on the sidewall of the second dummy gate structure 174, and the fourth structure may be referred to as a sixth structure. In example embodiments, a plurality of fifth structures may be formed to be spaced apart from each other in each of the first and second directions, and a plurality of sixth structures may be formed to be spaced apart from each other in each of the first and second directions. A first opening 190 may be formed between neighboring ones of the fifth and sixth structures.

Referring to FIG. 13, opposite sidewalls in the first direction of the first sacrificial patterns 116 and the second sacrificial patterns exposed by the first opening 190 may be etched to form recesses, and an inner spacer 200 may be formed to fill each of the recesses.

In example embodiments, the recesses may be formed by a wet etching process on the first sacrificial patterns 116 and the second sacrificial patterns. The inner spacer 200 may be formed by a deposition process, e.g., a chemical vapor deposition (CVD) process, an atomic layer deposition (ALD) process, etc.

In an example embodiment, the inner spacer 200 may have a thickness in the first direction substantially equal to a thickness in the first direction of each of the first and second gate spacers 182 and 184.

Referring to FIGS. 14 and 15, first and second epitaxial layers 212 and 214 may be formed on upper surfaces of the first and second active fins 102 and 104, respectively, of the substrate 100 exposed by the first opening 190.

In example embodiments, the first and second epitaxial layers 212 and 214 may be formed by a selective epitaxial growth (SEG) process using the exposed upper surfaces of the first and second active fins 102 and 104 by the first opening 190 as a seed.

In example embodiments, the SEG process may be performed using a silicon source gas such as disilane ($Si_2H_6$) and a carbon source gas such as $SiH_3CH_3$, to form a single crystalline silicon carbide (SiC) layer. In an example embodiment, the SEG process may be performed using only the silicon source gas such as disilane ($Si_2H_6$), to form a single crystalline silicon layer.

Alternatively, the SEG process may be performed, using a silicon source gas such as dichlorosilane ($SiH_2Cl_2$) and a germanium source gas such as germane ($GeH_4$), to form a single crystalline silicon germanium (SiGe) layer.

In example embodiments, the first and second epitaxial layers 212 and 214 may be formed on sidewalls in the first direction of the fifth and sixth structures, respectively. In example embodiments, the first and second epitaxial layers 212 and 214 may contact sidewalls of the third and fourth structures, respectively, and further grow to contact sidewalls of the first and second gate spacers 182 and 184, respectively, on the third and fourth structures, respectively.

In some embodiments, the first and second epitaxial layers 212 and 214 may be formed by a laser epitaxial growth (LEG) process or a solid phase epitaxy (SPE) process.

The first and second epitaxial layers 212 and 214 may serve as source/drain layers of the first and second transistors, respectively. An impurity doping process and a heat treatment process may be further performed on the first and second epitaxial layers 212 and 214. For example, when the first and second epitaxial layers 212 and 214 include silicon carbide or silicon, n-type impurities may be doped thereinto and a heat treatment may be performed to form a source/drain layer of an NMOS transistor. When the first and second epitaxial layers 212 and 214 include silicon-germanium, p-type impurities may be doped thereinto and a heat treatment may be performed to form a source/drain layer of a PMOS transistor.

Figure 16:
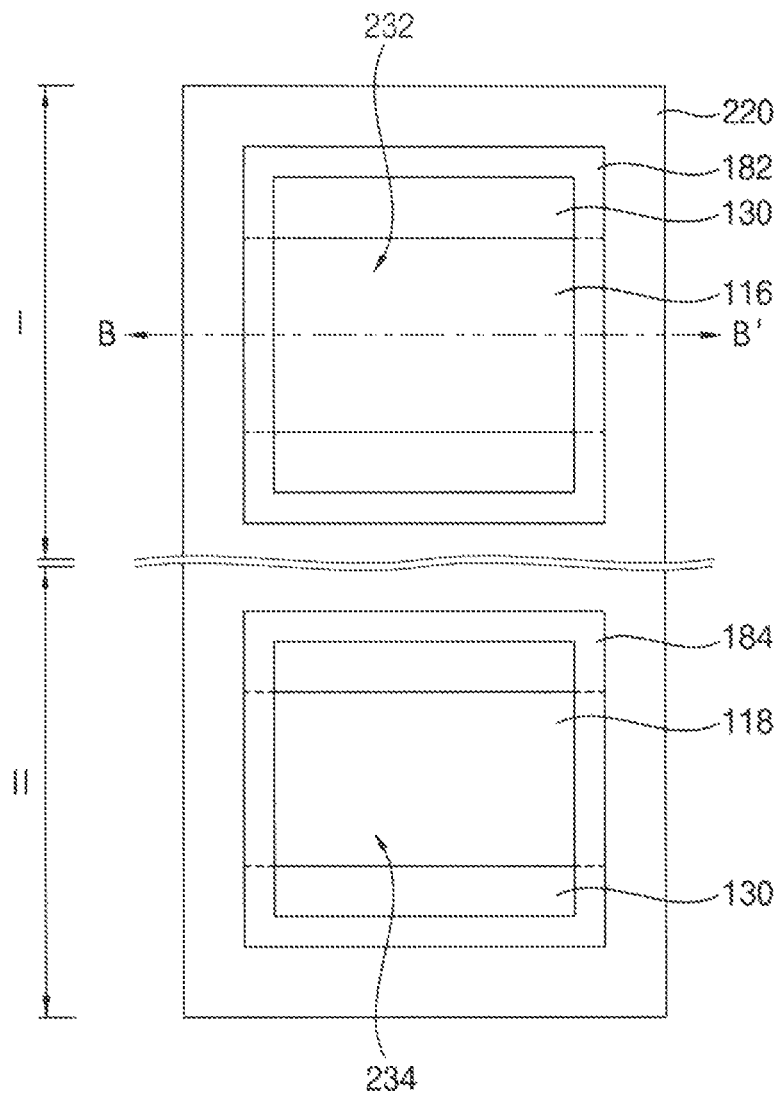

Referring to FIGS. 16 and 17, an insulation layer 220 may be formed on the substrate 100 to cover the fifth and sixth structures and the first and second epitaxial layers 212 and 214, and may be planarized until upper surfaces of the first and second dummy gate electrodes 152 and 154 of the fifth and sixth structures, respectively, may be exposed. During the planarization process, the first and second dummy gate masks 162 and 164 may be also removed, and upper portions of the first and second gate spacers 182 and 184 may be removed.

The planarization process may be performed by a chemical mechanical polishing (CMP) process and/or an etch back process.

The exposed first and second dummy gate electrodes 152 and 154 and the first and second dummy gate insulation patterns 142 and 144 may be removed to form a second opening 232 exposing an inner sidewall of the first gate spacer 182, an inner sidewall of the inner spacer 200, surfaces of the first semiconductor patterns 126, and the upper surface of the first active fin 102, and to form a third opening 234 exposing an inner sidewall of the second gate spacer 184, the inner sidewall of the inner spacer 200, surfaces of the second semiconductor patterns 128, and the upper surface of the second active fin 104.

Referring to FIGS. 1 to 3 again, first and second gate structures 282 and 284 may be formed on the first and second regions I and II, respectively, of the substrate 100 to fill the second and third openings 232 and 234, respectively.

Particularly, a thermal oxidation process may be performed on the upper surfaces of the first and second active fins 102 and 104 and the surfaces of the first and second semiconductor patterns 126 and 128 exposed by the second and third openings 232 and 234, respectively, to form first and second interface patterns 242 and 244, respectively, and a high-k dielectric layer and a first threshold voltage control layer may be sequentially formed on surfaces of the first and second interface patterns 242 and 244, the inner sidewall of the inner spacer 200, the inner sidewalls of the first and second gate spacers 182 and 184, and an upper surface of the insulation layer 220.

A first mask may be formed to cover the first region I of the substrate 100, and a portion of the first threshold voltage control layer on the second region II of the substrate 100 may be etched using the first mask as an etching mask to expose a portion of the high-k dielectric layer on the second region II of the substrate 100. Thus, the first threshold voltage control layer may remain on the first region I of the substrate 100.

A second threshold voltage control layer may be formed on the first threshold voltage control layer remaining on the first region I of the substrate 100 and the exposed portion of the high-k dielectric layer on the second region II of the substrate 100. A second mask may be formed to cover the second region II of the substrate 100, and a portion of the second threshold voltage control layer on the first region I of the substrate 100 may be etched using the second mask as an etching mask to expose the first threshold voltage control layer on the first region I of the substrate 100. Thus, the second threshold voltage control layer may remain on the second region II of the substrate 100.

A workfunction metal layer may be formed on the first and second threshold voltage control layers to fill the second and third openings 232 and 234.

The high-k dielectric layer, the first and second threshold voltage control layers, and the workfunction metal layer may be formed by, e.g., a CVD process, an ALD process, a physical vapor deposition (PVD) process, etc. The first and second interface patterns 242 and 244 may be also formed by a CVD process, an ALD process, etc., instead of the thermal oxidation process. In this case, the first and second interface patterns 242 and 244 may be also formed on the inner sidewall of the inner spacer 200 and the inner sidewalls of the first and second gate spacers 182 and 184.

In example embodiments, the first and second threshold voltage control layers may include different material compositions. The second threshold voltage control layer may have a thickness equal to or less than that of the first threshold voltage control layer.

The workfunction metal layer, the first and second threshold voltage control layers, and the high-k dielectric layer may be planarized until the upper surface of the insulation layer 20 may be exposed to form first and second workfunction metal patterns 272 and 274, first and second threshold voltage control patterns 262 and 264, and first and second high-k dielectric patterns 252 and 254, respectively.

The first interface pattern 242, the first high-k dielectric pattern 252, the first threshold voltage control pattern 262, and the first workfunction metal pattern 272 may form the first gate structure 282, and the second interface pattern 244, the second high-k dielectric pattern 254, the second threshold voltage control pattern 264, and the second workfunction metal pattern 274 may form the second gate structure 284.

Figure 18:
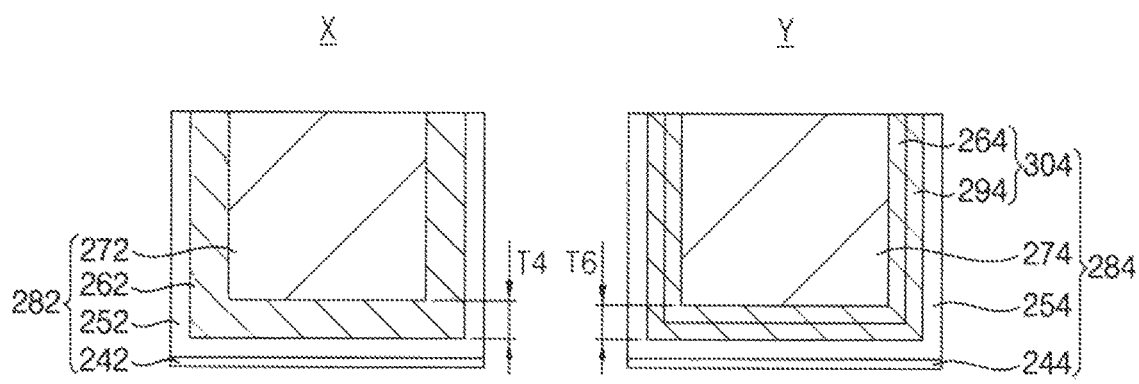
FIGS. 18 to 20 are cross-sectional views illustrating second to fourth semiconductor devices, respectively, in accordance with example embodiments.
Figure 19:
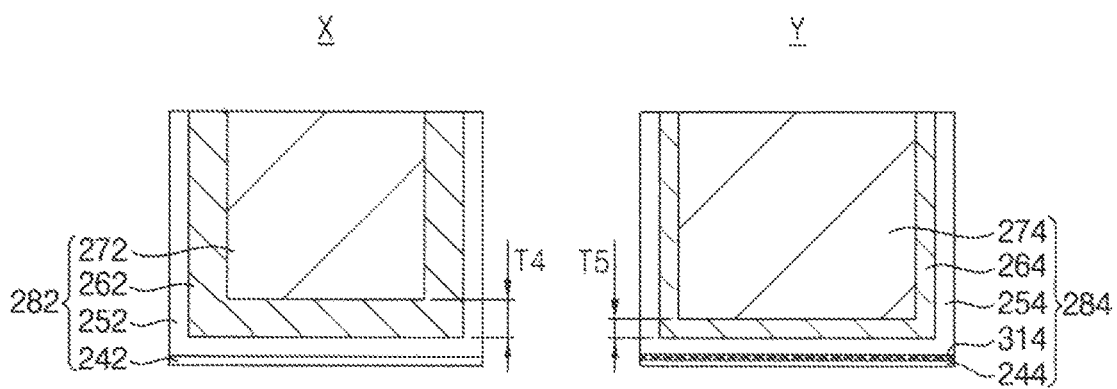
Figure 20:
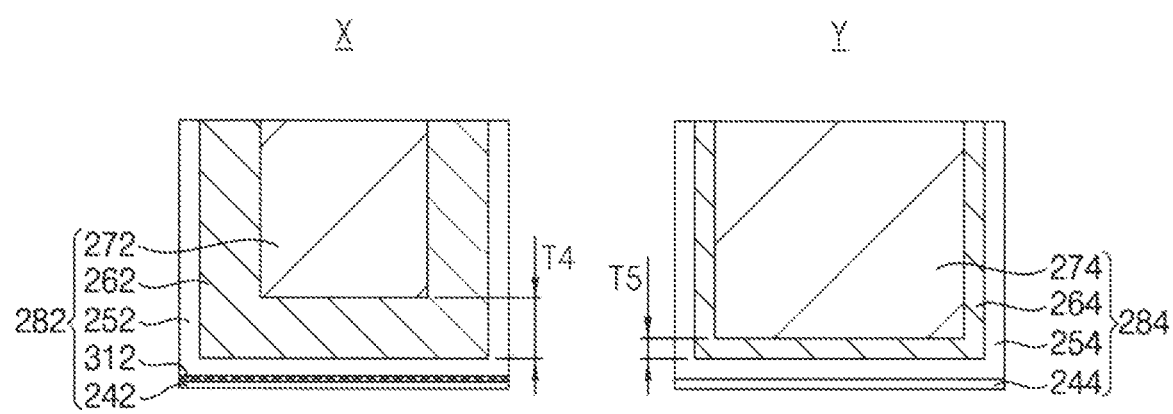

FIGS. 18 to 20 are cross-sectional views illustrating second to fourth semiconductor devices, respectively, in accordance with example embodiments. Each of FIGS. 18 to 20 is an enlarged cross-sectional view of regions X and Y of FIG. 3A. The second to fourth semiconductor devices may be substantially the same as or similar to the first semiconductor device. Thus, like reference numerals refer to like elements, and detailed descriptions thereon are omitted herein.

Referring to FIG. 18, the second gate structure 284 may include a threshold voltage control pattern structure 304 having third and second threshold voltage control patterns 294 and 264 sequentially stacked such that the third threshold voltage control pattern 294 is conformally provided between the second high-k dielectric pattern 254 and the second threshold voltage control pattern 264.

In example embodiments, the third threshold voltage control pattern 294 may include the substantially the same material composition as that of the first threshold voltage control pattern 262, e.g., titanium nitride, and thus may have a double-layered structure including a titanium nitride layer and a titanium silicon nitride layer sequentially stacked.

In example embodiments, a sixth thickness T6 of the threshold voltage control pattern structure 304 may be equal to or less than the fourth thickness T4 of the first threshold voltage control pattern 262. However, the second threshold voltage control pattern 264 of the threshold voltage control pattern structure 304 may have improved diffusion prevention characteristics for a workfunction metal, and thus the second threshold voltage higher than the first threshold voltage may be obtained. As illustrated in FIGS. 18, 19, and 20, the fourth thickness T4 of the first threshold voltage control pattern 262 may be uniform in a direction perpendicular to an upper surface of the substrate 100 and in a direction parallel to the upper surface of the substrate 100; the fifth thickness T5 of the second threshold voltage control pattern 264 may be uniform in a direction perpendicular to an upper surface of the substrate 100 and in a direction parallel to the upper surface of the substrate 100; and the sixth thickness T6 of the threshold voltage control pattern structure 304 may be uniform in a direction perpendicular to an upper surface of the substrate 100 and in a direction parallel to the upper surface of the substrate 100.

In some embodiments, although not illustrated in the figures, the threshold voltage control pattern structure 304 may include second and third threshold voltage control patterns 264 and 294 sequentially stacked such that the second threshold voltage control pattern 264 is conformally provided between the second high-k dielectric pattern 254 and the third threshold voltage control pattern 294.

Referring to FIG. 19, the second gate structure 284 may further include a second dipole layer 314 having dipoles at an interface between the second interface pattern 244 and the second high-k dielectric pattern 254 such that an upper surface of the second dipole layer 314 is in contact with a lower surface of the second high-k dielectric pattern 254 and a lower surface of the second dipole layer 314 is in contact with an upper surface of the second interface pattern 244.

In example embodiments, the second dipole layer 314 may include aluminum oxide dipoles, and the second threshold voltage of the second transistor may move in a positive direction. Thus, in an NMOS transistor, even if the second threshold voltage control pattern 264 includes the substantially the same material composition as that of the first threshold voltage control pattern 262, e.g., titanium nitride, the second threshold voltage control pattern 264 may have the fifth thickness T5 less than the fourth thickness T4 of the first threshold voltage control pattern 262, and the relatively high second threshold voltage may be obtained.

For example, the second dipole layer 314 may be formed by forming and thermally treating a layer including aluminum oxide on the second high-k dielectric pattern 254, so that dipoles of aluminum oxide in the layer may move into the interface between the second interface pattern 244 and the second high-k dielectric pattern 254.

Referring to FIG. 20, the first gate structure 282 may further include a first dipole layer 312 having dipoles at an interface between the first interface pattern 242 and the first high-k dielectric pattern 252 such that an upper surface of the first dipole layer 312 is in contact with a lower surface of the first high-k dielectric pattern 252 and a lower surface of the first dipole layer 312 is in contact with an upper surface of the first interface pattern 242.

When an element is referred to as "contacting" or "in contact with" another element, there are no intervening elements present.

In example embodiments, the first dipole layer 312 may include lanthanum oxide dipoles, and the first threshold voltage of the first transistor may move in a negative direction. Thus, the fourth thickness T4 of the first threshold voltage control pattern 262 in FIG. 20 may be more than the fourth thickness T4 of the first threshold voltage control pattern 262 in FIG. 3B.

Figure 21:
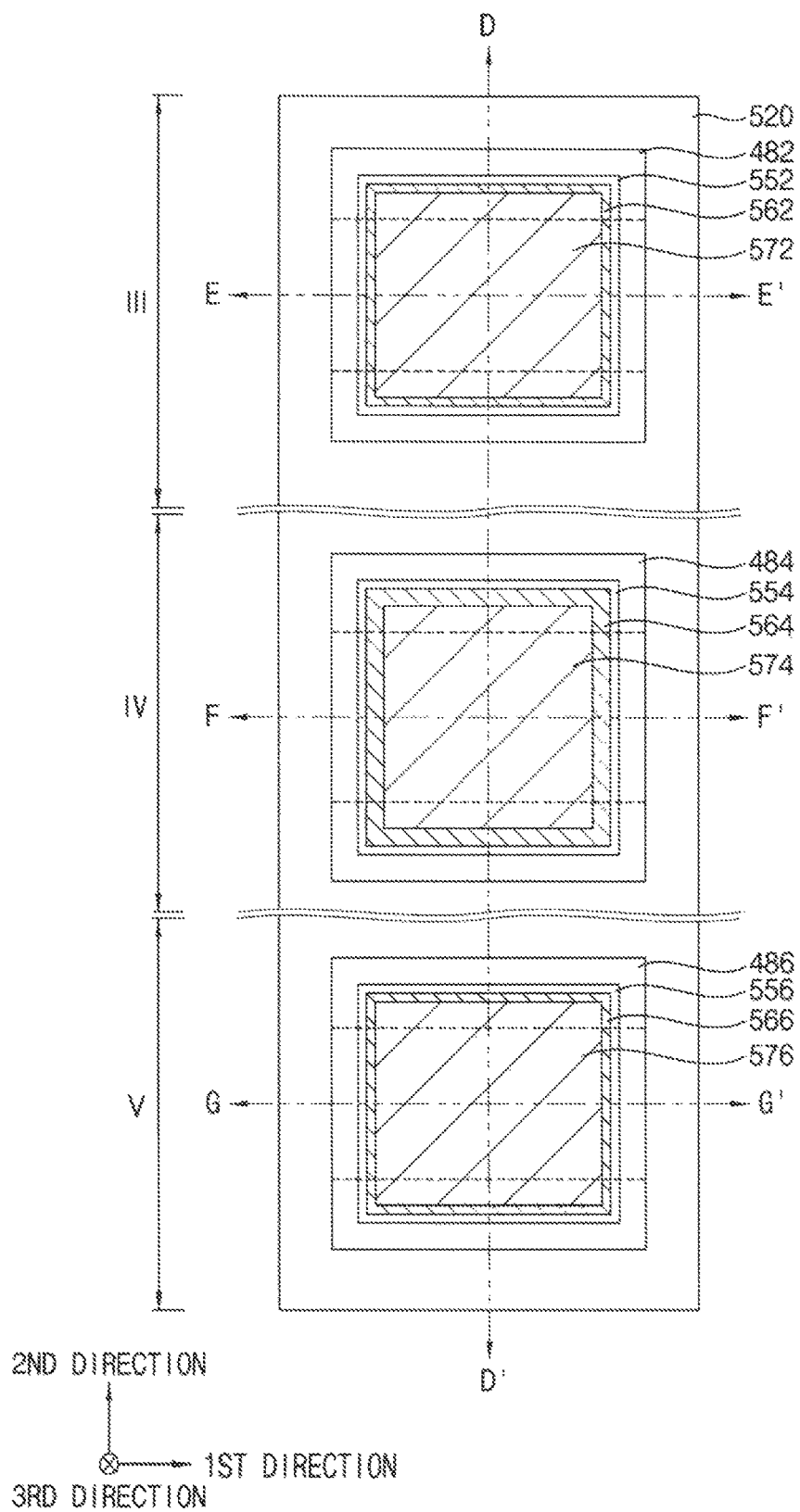
Figure 23B:
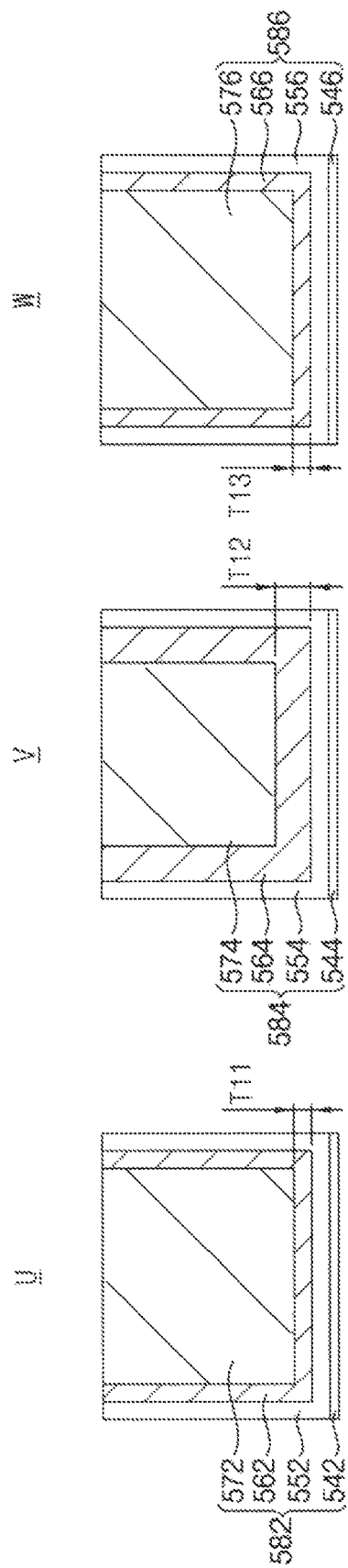

FIGS. 21, 22, 23A and 23B are a plan view and cross-sectional views illustrating a fifth semiconductor device in accordance with example embodiments. Particularly, FIG. 21 is a plan view, FIG. 22 is a cross-sectional view taken along a line D-D' of FIG. 21, FIG. 23A is a cross-sectional view taken along lines E-E', F-F' and G-G' of FIG. 21, and FIG. 23B is an enlarged cross-sectional view of regions U, V and W of FIG. 23A.

Referring to FIGS. 21, 22, 23A and 23B, the fifth semiconductor device may include third to fifth semiconductor patterns 422, 424 and 426, third to fifth epitaxial layers 512, 514 and 516, and third to fifth gate structures 582, 584 and 586 on a substrate 400. The fifth semiconductor device may further include third to fifth active fins 402, 404 and 406, an isolation pattern 430, third to fifth gate spacers 482, 484 and 486, an inner spacer 500, and an insulation layer 520.

The substrate 400 may include third to fifth regions III, IV and V. A relatively low voltage, a middle voltage, and a relatively high voltage may be applied to the third to fifth regions III, IV and V, respectively.

In example embodiments, the third to fifth semiconductor patterns 422, 424 and 426 may serve as channels of third to fifth transistors, respectively. Each of the third to fifth epitaxial layers 512, 514 and 516 may serve as a source/drain layer of an NMOS transistor or a PMOS transistor.

The third to fifth gate structures 582, 584 and 586 may be formed on the third to fifth regions III, IV and V, respectively, of the substrate 400, and may surround the third to fifth semiconductor patterns 422, 424 and 426, respectively.

The third gate structure 582 may include a third gate insulation pattern, a fourth threshold voltage control pattern 562, and a third workfunction metal pattern 572 sequentially stacked from a surface of each of the third semiconductor patterns 422, and the third gate insulation pattern may include a third interface pattern 542 and a third high-k dielectric pattern 552 sequentially stacked. The third gate structure 582 together with the third epitaxial layer 512 and the third semiconductor pattern 422 may form the third transistor.

The fourth gate structure 584 may include a fourth gate insulation pattern, a fifth threshold voltage control pattern 564, and a fourth workfunction metal pattern 574 sequentially stacked from a surface of each of the fourth semiconductor patterns 424, and the fourth gate insulation pattern may include a fourth interface pattern 544 and a fourth high-k dielectric pattern 554 sequentially stacked. The fourth gate structure 584 together with the fourth epitaxial layer 514 and the fourth semiconductor pattern 424 may form the fourth transistor.

The fifth gate structure 586 may include a fifth gate insulation pattern, a sixth threshold voltage control pattern 566, and a fifth workfunction metal pattern 576 sequentially stacked from a surface of each of the fifth semiconductor patterns 426, and the fifth gate insulation pattern may include a fifth interface pattern 546 and a fifth high-k dielectric pattern 556 sequentially stacked. The fifth gate structure 586 together with the fifth epitaxial layer 516 and the fifth semiconductor pattern 426 may form the fifth transistor.

In example embodiments, each of the third to fifth transistors may be an NMOS transistor, and third to fifth threshold voltages of the respective third to fifth transistors on the respective third to fifth regions III, IV and V may increase in this order. For example, the fifth threshold voltage may be greater than the fourth threshold voltage, and the fourth threshold voltage may be greater than the third threshold voltage. Additionally, third to fifth workfunctions of the respective third to fifth gate structures 582, 584 and 586 may increase in this order. For example, the fifth workfunction of the fifth gate structure 586 may be greater than the fourth workfunction of fourth gate structure 584, and the fourth workfunction of fourth gate structure 584 may be greater than the third workfunction of third gate structure 582.

In example embodiments, the fourth and fifth threshold voltage control patterns 562 and 564 may include substantially the same material composition, e.g., titanium nitride, and as the fourth threshold voltage is greater than the third threshold voltage, a twelfth thickness T12 of the fifth threshold voltage control pattern 564 may be greater than an eleventh thickness T11 of the fourth threshold voltage control pattern 562. The sixth threshold voltage control pattern 566 may include a different material composition from that of the fourth and fifth threshold voltage control patterns 562 and 564, e.g., titanium silicon nitride, and thus the fifth threshold voltage may be greater than the fourth threshold voltage, however, a thirteenth thickness T13 of the sixth threshold voltage control pattern 566 may be equal to or less than the twelfth thickness T12 of the fifth threshold voltage control pattern 564.

A ninth thickness T9 in the vertical direction of a portion of the fourth workfunction metal pattern 574 of the fourth transistor between the fourth semiconductor patterns 424 may be equal to or less than an eighth thickness T8 in the vertical direction of a portion of third workfunction metal pattern 572 of the third transistor between the third semiconductor patterns 422. Also, the ninth thickness T9 in the vertical direction of a portion of the fourth workfunction metal pattern 574 of the fourth transistor between the fourth semiconductor patterns 424 may be equal to or less than a tenth thickness T10 in the vertical direction of a portion of fifth workfunction metal pattern 576 of the fifth transistor between the fifth semiconductor patterns 426.

Additionally, the ninth thickness T9 in the vertical direction of the portion of the fourth workfunction metal pattern 574 of the fourth transistor between the fourth semiconductor patterns 424 may be less than twice a seventh thickness T7 in the horizontal direction of a portion of the fourth workfunction metal pattern 574 stacked from a sidewall of the fifth threshold voltage control pattern 564 in the second direction.

Figure 24:
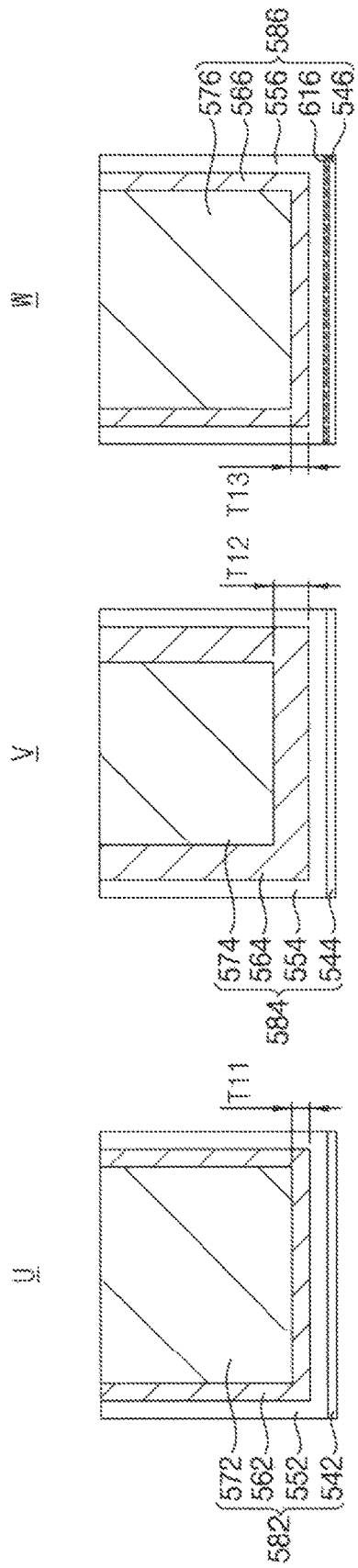
FIG. 24 is a cross-sectional view illustrating a sixth semiconductor device in accordance with example embodiments.

FIG. 24 is a cross-sectional view illustrating a sixth semiconductor device in accordance with example embodiments. Particularly, FIG. 24 is an enlarged cross-sectional view of regions U, V and W of FIG. 24. The sixth semiconductor device may be substantially the same as or similar to the fifth semiconductor device, except for the gate structure.

Referring to FIG. 24, the fifth gate structure 586 of the fifth transistor may further include a third dipole layer 616 having dipoles at an interface between the fifth interface pattern 546 and the fifth high-k dielectric pattern 556 such that an upper surface of the third dipole layer 616 is in contact with a lower surface of the fifth high-k dielectric pattern 556 and a lower surface of the third dipole layer 616 is in contact with an upper surface of the fifth interface pattern 546.

In example embodiments, the third dipole layer 616 may include aluminum oxide dipoles, and the fifth threshold voltage of the fifth transistor may move in a positive direction. Thus, in an NMOS transistor, even if the sixth threshold voltage control pattern 566 includes substantially the same material composition as that of the fifth threshold voltage control pattern 564, e.g., titanium nitride, the sixth threshold voltage control pattern 566 may have a thirteenth thickness T13 less than the twelfth thickness T12 of the fifth threshold voltage control pattern 564, and the relatively higher fifth threshold voltage may be obtained compared to the fourth threshold voltage.

Figure 25:
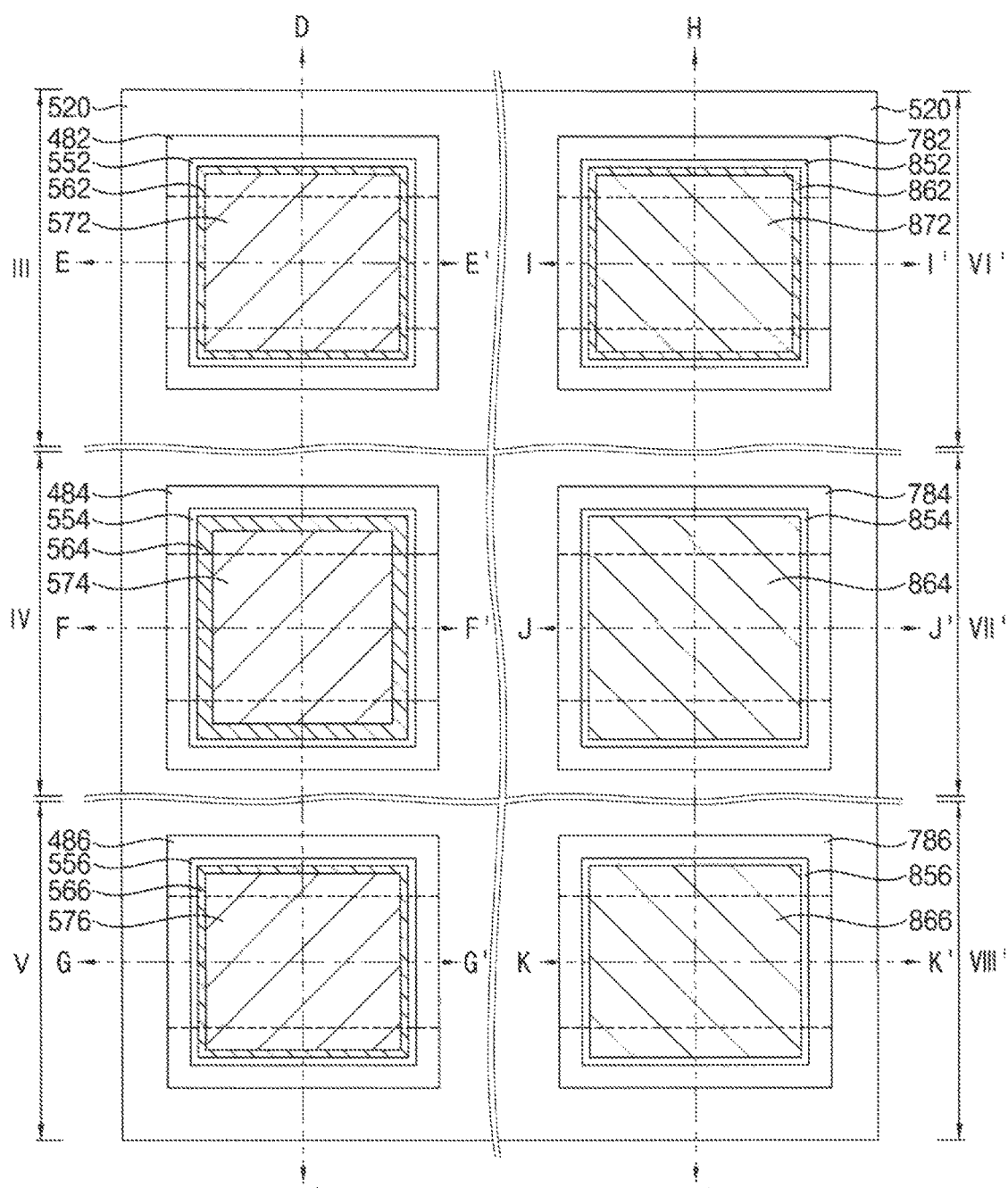
FIGS. 25, 26, 27A and 27B are a plan view and cross-sectional views illustrating an eighth semiconductor device in accordance with example embodiments.
Figure 26:
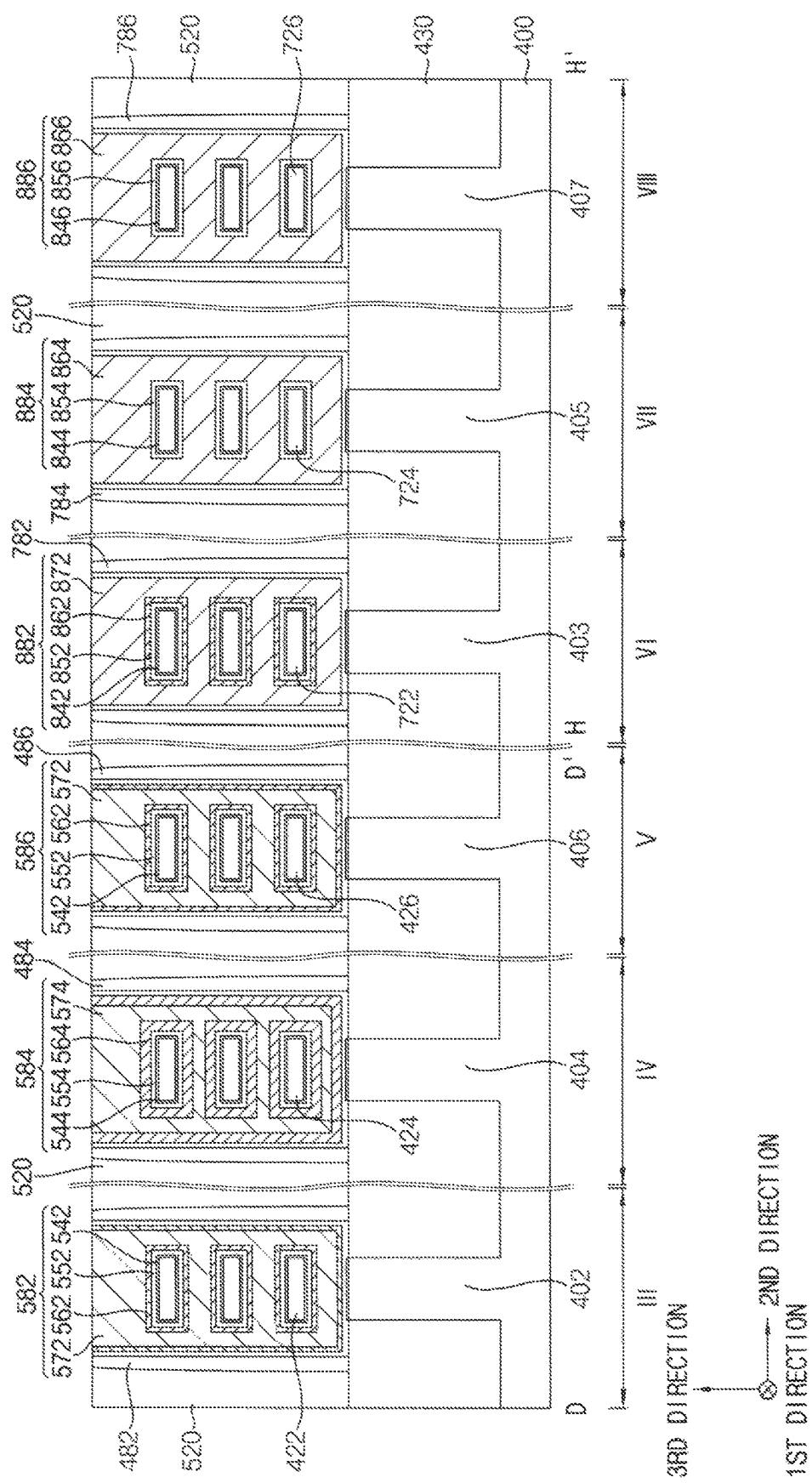
Figure 27A:
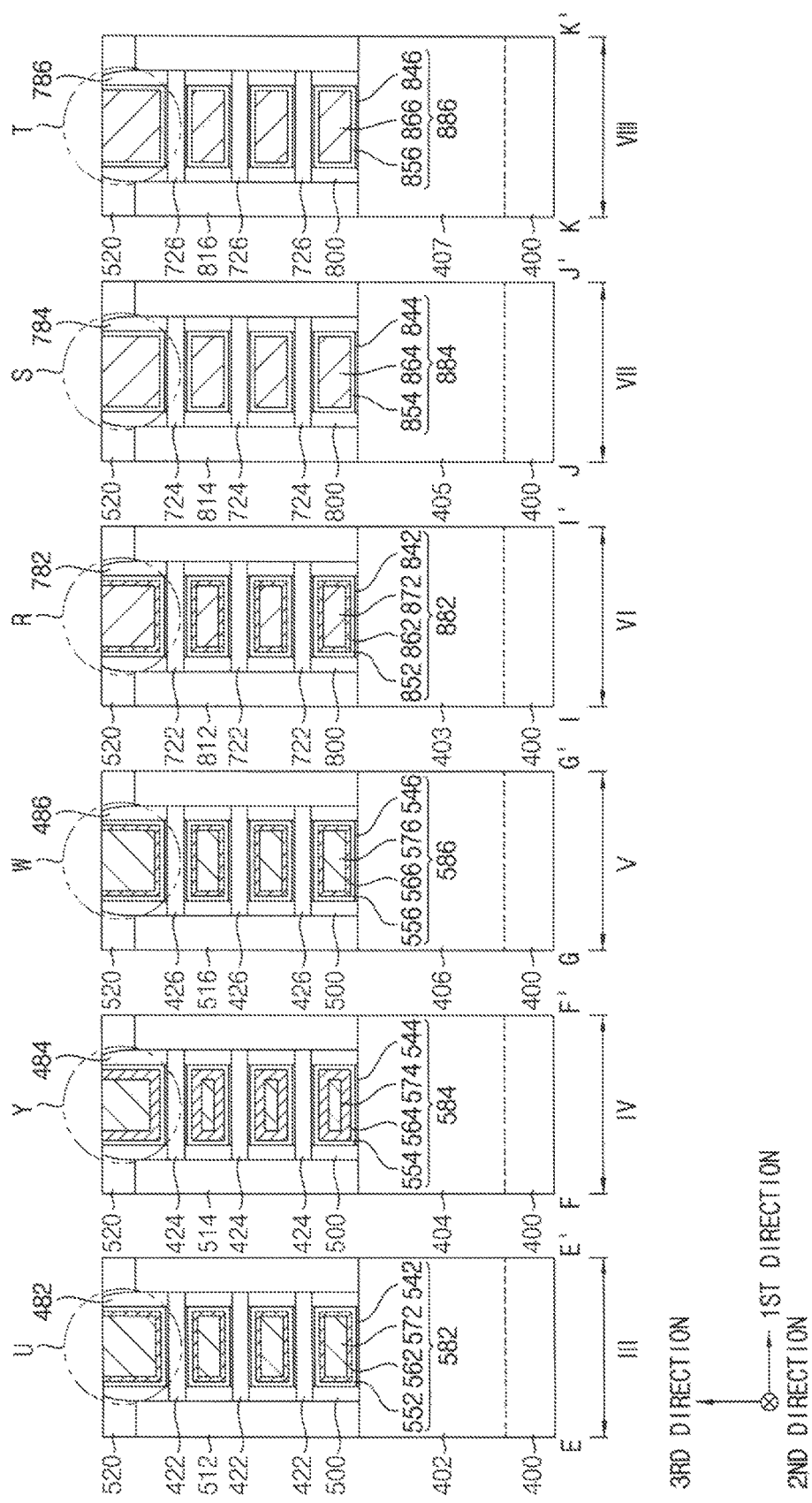
Figure 27B:
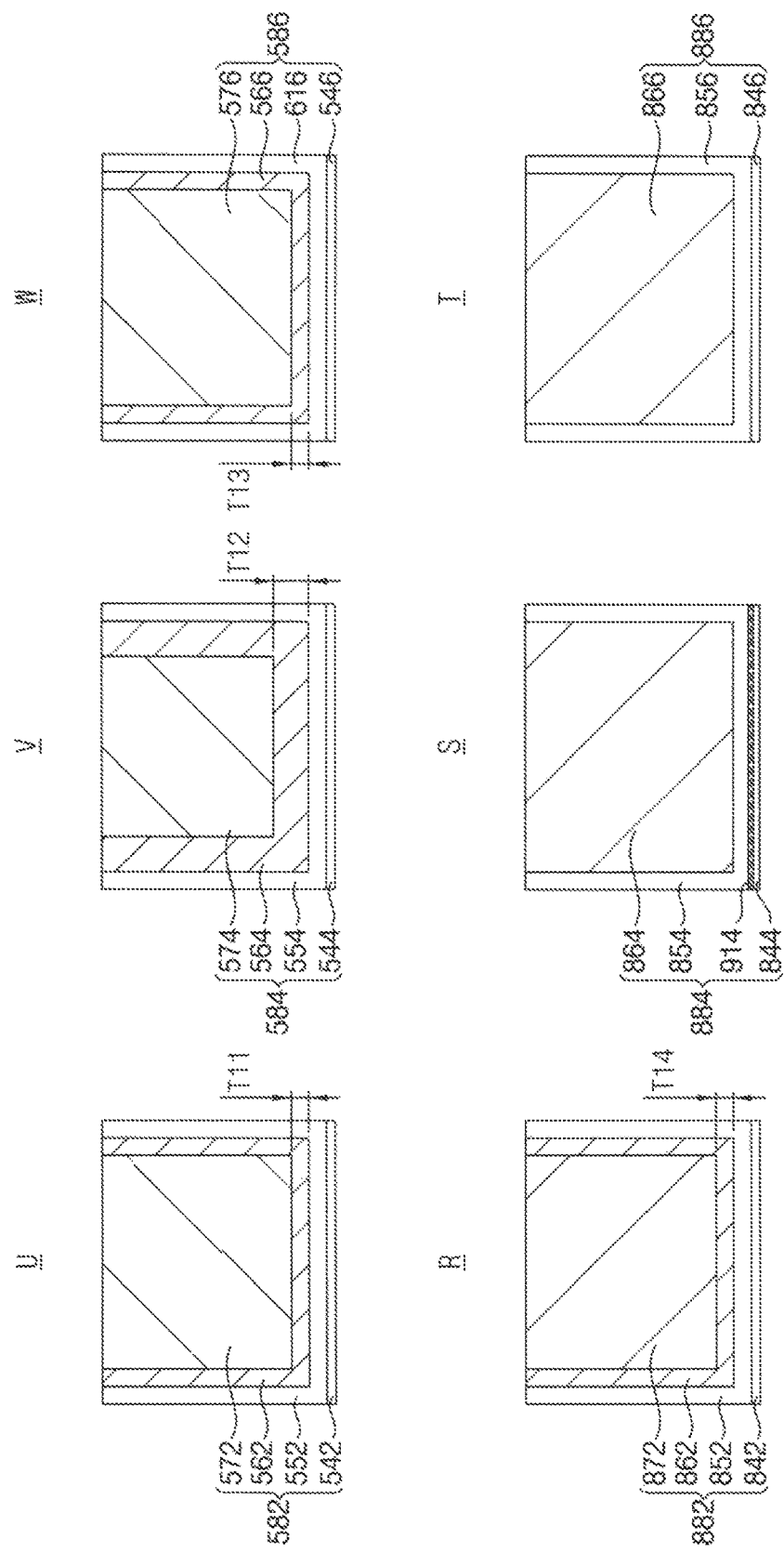

FIGS. 25, 26, 27A and 27B are a plan view and cross-sectional views illustrating an eighth semiconductor device in accordance with example embodiments. Particularly, FIG. 25 is a plan view, FIG. 26 is a cross-sectional view taken along lines D-D' and H-H' of FIG. 25, FIG. 27A is a cross-sectional view taken along lines I-I', J-J' and K-K' of FIG. 25, and FIG. 27B is an enlarged cross-sectional view of regions U, V, W, R, S and T of FIG. 27A.

The eighth semiconductor device may further include a seventh semiconductor device on sixth to eighth regions VI, VII and VIII of the substrate 400 in addition to the sixth semiconductor on the third to fifth regions III, IV and V of the substrate 400. Thus, only the seventh semiconductor device will be described.

In example embodiments, the third to fifth regions III, IV and V of the substrate 400 may be NMOS regions, and the sixth to eighth regions VI, VII and VIII of the substrate 400 may be PMOS regions. For example, the sixth and seventh semiconductor devices may include NMOS transistors and PMOS transistors, respectively.

Referring to FIGS. 25, 26, 27A and 27B, the seventh semiconductor device may include sixth to eighth semiconductor patterns 722, 724 and 726, sixth to eighth epitaxial layers 812, 814 and 816, and sixth to eighth gate structures 882, 884 and 886 on the substrate 400. The seventh semiconductor device may further include sixth to eighth active fins 403, 405 and 407, the isolation pattern 430, sixth to eighth gate spacers 782, 784 and 786, an inner spacer 800, and the insulation layer 520.

The sixth to eighth gate structures 882, 884 and 886 may be formed on the sixth to eighth regions VI, VII and VIII, respectively, of the substrate 400, and may surround sixth to eighth semiconductor patterns 722, 724 and 726, respectively.

The sixth gate structure 882 may include a sixth gate insulation pattern, a seventh threshold voltage control pattern 862, and an eighth threshold voltage control pattern 872 sequentially stacked from a surface of each of the sixth semiconductor patterns 722, and the sixth gate insulation pattern may include a sixth interface pattern 842 and a sixth high-k dielectric pattern 852 sequentially stacked. The sixth gate structure 882 together with the sixth epitaxial layer 812 and the sixth semiconductor pattern 722 may form a sixth transistor.

The seventh gate structure 884 may include a seventh gate insulation pattern and a ninth threshold voltage control pattern 864 sequentially stacked from a surface of each of the seventh semiconductor patterns 724, and the seventh gate insulation pattern may include a seventh interface pattern 844 and a seventh high-k dielectric pattern 854 sequentially stacked, and a fourth dipole layer 914 at an interface therebetween. The seventh gate structure 884 together with the seventh epitaxial layer 814 and the seventh semiconductor pattern 724 may form a seventh transistor.

The eighth gate structure 886 may include an eighth gate insulation pattern and a tenth threshold voltage control pattern 866, and the eighth gate insulation pattern may include an eighth interface pattern 846 and an eighth high-k dielectric pattern 856 sequentially stacked. The eighth gate structure 886 together with the eighth epitaxial layer 816 and the eighth semiconductor pattern 726 may form an eighth transistor.

In example embodiments, all of sixth to eighth threshold voltages of the respective sixth to eighth transistors on the respective sixth to eighth regions VI, VII and VIII may have negative values, and absolute values of the sixth to eighth threshold voltages may decrease in this order. For example, the absolute value of the sixth threshold voltage may be greater than the absolute value of the seventh threshold voltage, and the absolute value of the seventh threshold voltage may be greater than the absolute value of the eighth threshold voltage.

In example embodiments, the ninth and tenth threshold voltage control patterns 864 and 866 may include substantially the same material, e.g., titanium nitride, and may have substantially the same thickness. However, as the fourth dipole layer 914 includes, e.g., lanthanum oxide dipoles, the seventh threshold voltage of the seventh transistor may move in a negative direction, and thus the absolute value of the seventh threshold voltage of the seventh transistor may be greater than the absolute value of the eighth threshold voltage of the eighth transistor.

The sixth transistor may include the seventh and eighth threshold voltage control patterns 862 and 872 sequentially stacked, and the seventh and eighth threshold voltage control patterns 862 and 872 may include, e.g., titanium silicon nitride and titanium nitride, respectively. As the sixth transistor has the seventh threshold voltage control pattern 862 including titanium silicon nitride having good diffusion prevention characteristics for a workfunction metal, the sixth threshold voltage of which an absolute value is high may be obtained.

In the figures, according to exemplary embodiments, the sixth to eighth transistors are shown to include no workfunction metal patterns, however, the inventive concepts may not be limited thereto. Thus, in some embodiments, the sixth to eighth transistors may include workfunction metal patterns, respectively, according to the distances between channels.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a first transistor having a first threshold voltage, the first transistor including:
first channels on a substrate, the first channels being spaced apart from each other in a vertical direction on an upper surface of the substrate;
first source/drain layers on the substrate, the first source/drain layers being connected to respective opposite sidewalls of the first channels; and
a first gate structure surrounding the first channels and including a first gate insulation pattern, a first threshold voltage control pattern, and a first workfunction metal pattern sequentially stacked from a surface of each of the first channels; and
a second transistor having a second threshold voltage greater than the first threshold voltage, the second transistor including:
second channels on the substrate, the second channels being spaced apart from each other in the vertical direction on the upper surface of the substrate;
second source/drain layers on the substrate, the second source/drain layers being connected to respective opposite sidewalls of the second channels; and
a second gate structure surrounding the second channels and including a second gate insulation pattern, a second threshold voltage control pattern, and a second workfunction metal pattern sequentially stacked from a surface of each of the second channels,
wherein a thickness of the second threshold voltage control pattern in a direction perpendicular to the upper surface of the substrate is equal to or less than a thickness of the first threshold voltage control pattern in the direction perpendicular to the upper surface of the substrate.

2. The semiconductor device of claim 1, wherein the first threshold voltage control pattern has a material composition different from a material composition of the second threshold voltage control pattern.

3. The semiconductor device of claim 1, wherein each of the first and second threshold voltage control patterns includes at least one of titanium nitride, titanium oxynitride, titanium oxycarbonitride, titanium silicon nitride, titanium silicon oxynitride, titanium aluminum oxynitride, tantalum nitride, tantalum oxynitride, tantalum aluminum nitride, tantalum aluminum oxynitride, tungsten nitride, tungsten carbonitride, and aluminum oxide.

4. The semiconductor device of claim 3, wherein the first threshold voltage control pattern includes titanium nitride, and the second threshold voltage control pattern includes titanium silicon nitride.

5. The semiconductor device of claim 3, wherein the first threshold voltage control pattern has a single layer, and the second threshold voltage control pattern includes a double-layered structure.

6. The semiconductor device of claim 5, wherein the first threshold voltage control pattern includes a titanium nitride layer, and the second threshold voltage control pattern includes a titanium nitride layer and a titanium silicon nitride layer sequentially stacked.

7. The semiconductor device of claim 1, wherein the first gate insulation pattern includes a first interface pattern and a first high-k dielectric pattern sequentially stacked, and the second gate insulation pattern includes a second interface pattern and a second high-k dielectric pattern sequentially stacked.

8. The semiconductor device of claim 7, wherein the second gate insulation pattern further includes a dipole layer at an interface between the second interface pattern and the second high-k dielectric pattern, the dipole layer including aluminum oxide dipoles.

9. The semiconductor device of claim 8, wherein the first and second threshold voltage control patterns have the same material composition.

10. The semiconductor device of claim 9, wherein each of the first and second threshold voltage control patterns includes a titanium nitride layer.

11. The semiconductor device of claim 8, wherein the second interface pattern includes silicon oxide, and the second high-k dielectric pattern includes at least one of hafnium oxide, tantalum oxide, and zirconium oxide.

12. The semiconductor device of claim 7, further comprising a dipole layer at an interface between the first interface pattern and the first high-k dielectric pattern, the dipole layer including lanthanum oxide dipoles.

13. The semiconductor device of claim 12, wherein the first interface pattern includes silicon oxide, and the first high-k dielectric pattern includes at least one of hafnium oxide, tantalum oxide, and zirconium oxide.

14. The semiconductor device of claim 1, wherein a thickness in the vertical direction of a portion of the first workfunction metal pattern between the first channels is equal to or less than a thickness in the vertical direction of a portion of the second workfunction metal pattern between the second channels.

15. A semiconductor device of claim 1, further comprising:
a third transistor having a third threshold voltage greater than the second threshold voltage, the third transistor including:
third channels on the substrate, the third channels being spaced apart from each other in the vertical direction on the upper surface of the substrate;
third source/drain layers on the substrate, the third source/drain layers being connected to respective opposite sidewalls of the third channels; and
a third gate structure surrounding the third channels and including a third gate insulation pattern, a third threshold voltage control pattern, and a third workfunction metal pattern sequentially stacked from a surface of each of the third channels,
wherein each of a thickness of the first and third threshold voltage control patterns in a direction perpendicular to the upper surface of the substrate is equal to or less than a thickness of the second threshold voltage control pattern in the direction perpendicular to the upper surface of the substrate.

16. The semiconductor device of claim 15, wherein the first and second threshold voltage control pattern have the same first material composition, and the third threshold voltage control pattern has a second material composition different from the first material composition.

17. The semiconductor device of claim 16, wherein the first and second threshold voltage control patterns include titanium nitride, and the third threshold voltage control pattern includes titanium silicon nitride.

18. The semiconductor device of claim 15, wherein each of the first and second threshold voltage control patterns includes a titanium nitride layer, and the third threshold voltage control pattern includes a titanium nitride layer and a titanium silicon nitride layer sequentially stacked.

19. The semiconductor device of claim 15, wherein the first gate insulation pattern includes a first interface pattern and a first high-k dielectric pattern sequentially stacked, the second gate insulation pattern includes a second interface pattern and a second high-k dielectric pattern sequentially stacked, and the third gate insulation pattern includes a third interface pattern and a third high-k dielectric pattern sequentially stacked.

20. A semiconductor device, comprising:
a first transistor having a positive first threshold voltage, the first transistor including:
first channels on a first region of a substrate including the first region and a second region, the first channels being spaced apart from each other in a vertical direction on an upper surface of the substrate;
first source/drain layers on the first region of the substrate, the first source/drain layers being connected to respective opposite sidewalls of the first channels; and
a first gate structure surrounding the first channels and including a first gate insulation pattern, a first threshold voltage control pattern, and a first workfunction metal pattern sequentially stacked from a surface of each of the first channels;
a second transistor having a positive second threshold voltage greater than the positive first threshold voltage, the second transistor including:
second channels on the first region of the substrate, the second channels being spaced apart from each other in the vertical direction on the upper surface of the substrate;
second source/drain layers on the first region of the substrate, the second source/drain layers being connected to respective opposite sidewalls of the second channels; and
a second gate structure surrounding the second channels and including a second gate insulation pattern, a second threshold voltage control pattern, and a second workfunction metal pattern sequentially stacked from a surface of each of the second channels; and
a third transistor having a negative third threshold voltage, the third transistor including:
third channels on the second region of the substrate, the third channels being spaced apart from each other in the vertical direction on the upper surface of the substrate;
third source/drain layers on the substrate, the third source/drain layers being connected to respective opposite sidewalls of the third channels; and
a third gate structure surrounding the third channels and including a third gate insulation pattern and a third threshold voltage control pattern sequentially stacked from a surface of each of the third channels,
wherein the first threshold voltage control pattern has a first pattern having a first material composition, the second threshold voltage control pattern has a second pattern having a second material composition different from the first material composition, and the third threshold voltage control pattern has the first and second patterns.

* * * * *